(12) United States Patent
Lee

(10) Patent No.: US 9,287,524 B2
(45) Date of Patent: Mar. 15, 2016

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Kun-Won Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/464,838

(22) Filed: Aug. 21, 2014

(65) Prior Publication Data
US 2015/0102318 A1 Apr. 16, 2015

(30) Foreign Application Priority Data
Oct. 15, 2013 (KR) .................. 10-2013-0122637

(51) Int. Cl.
| | |
|---|---|
| H01L 29/08 | (2006.01) |
| H01L 29/04 | (2006.01) |
| H01L 27/14 | (2006.01) |
| H01L 29/18 | (2006.01) |
| H01L 51/52 | (2006.01) |

(52) U.S. Cl.
CPC ................... *H01L 51/5253* (2013.01)

(58) Field of Classification Search
CPC ... H01L 51/524; H01L 51/56; H01L 51/0097; H01L 2251/558

USPC ........ 257/40, 88, 59, E51.02, 72, 91; 438/28, 438/34; 428/172
See application file for complete search history.

(56) References Cited

U.S. PATENT DOCUMENTS

| 7,812,531 | B2 | 10/2010 | Boroson et al. | |
|---|---|---|---|---|
| 2001/0004469 | A1* | 6/2001 | Himeshima et al. | 427/66 |
| 2003/0127973 | A1* | 7/2003 | Weaver et al. | 313/504 |
| 2005/0224935 | A1* | 10/2005 | Schaepkens et al. | 257/678 |
| 2009/0267487 | A1* | 10/2009 | Kwack et al. | 313/503 |
| 2011/0163330 | A1* | 7/2011 | Kim et al. | 257/88 |
| 2011/0198620 | A1* | 8/2011 | Han et al. | 257/88 |
| 2013/0037792 | A1 | 2/2013 | Kim et al. | |

FOREIGN PATENT DOCUMENTS

| KR | 10-2012-0094874 A | 8/2012 |
|---|---|---|
| KR | 10-2012-0133272 A | 12/2012 |

\* cited by examiner

*Primary Examiner* — Long K Tran
*Assistant Examiner* — Dzung Tran
(74) *Attorney, Agent, or Firm* — Lee & Morse, P.C.

(57) ABSTRACT

An organic light emitting display device includes a substrate, a display element on the substrate, and an encapsulation member on the substrate. The encapsulation member encapsulates the display element. The encapsulation member includes a plurality of organic layers and a plurality of inorganic layers. Each inorganic layer includes a plurality of inorganic blocks that are separate from each other. The inorganic layers are between the organic layers.

14 Claims, 30 Drawing Sheets

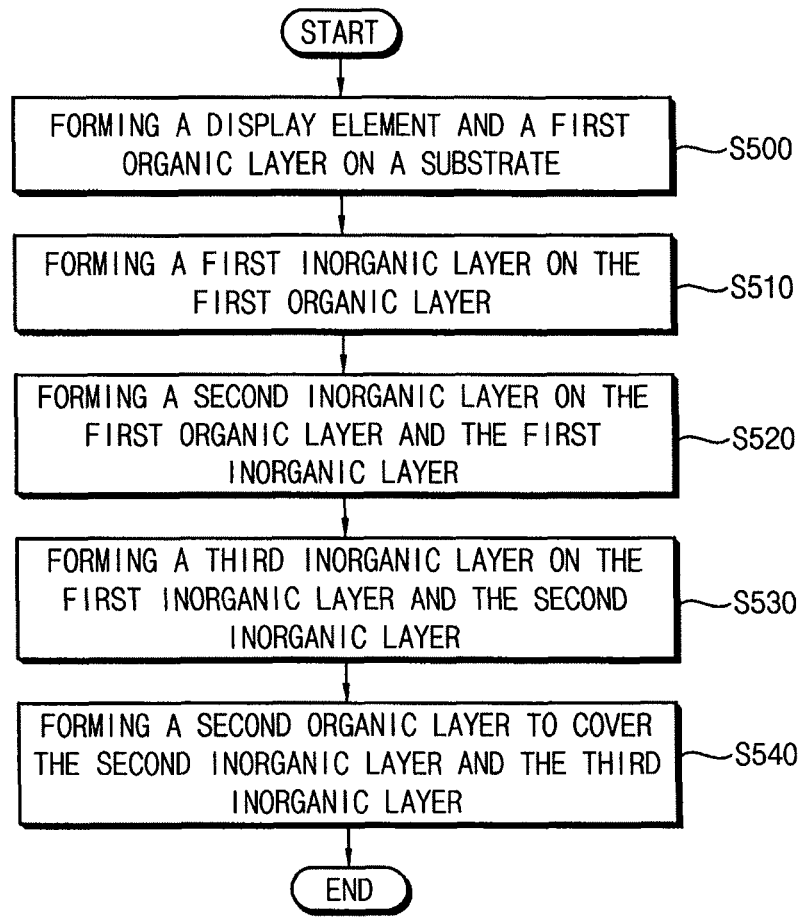
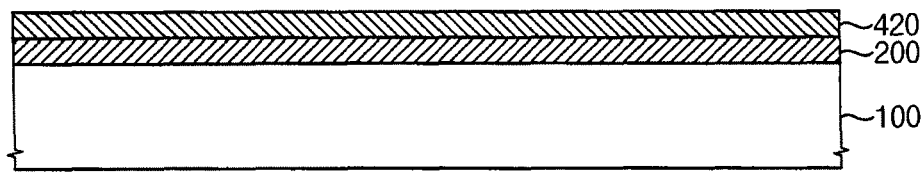

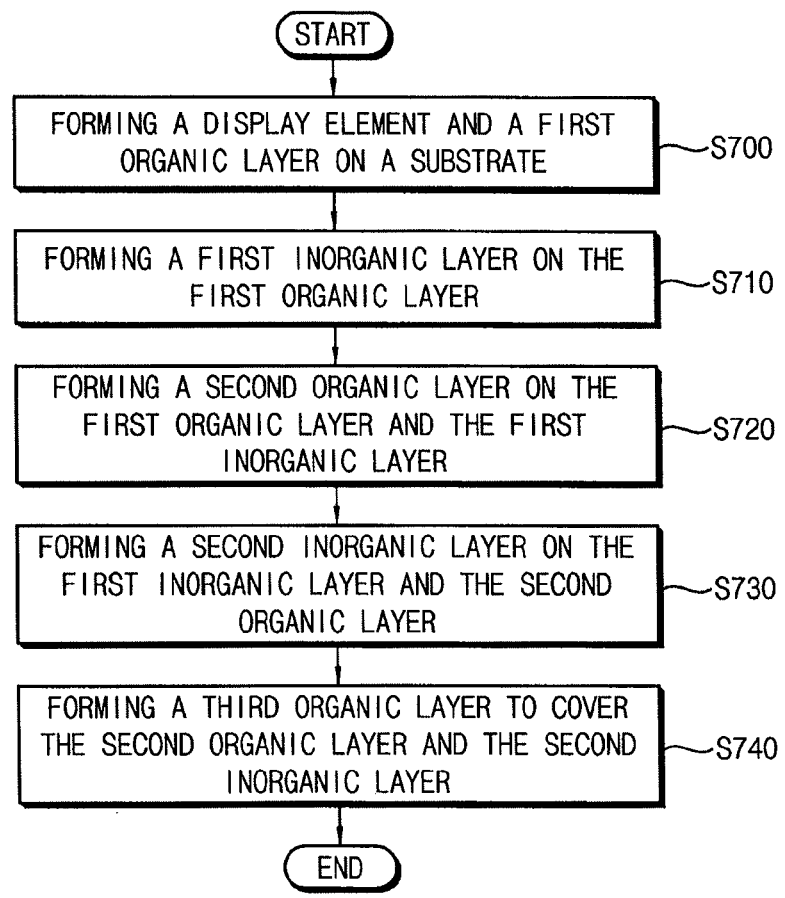
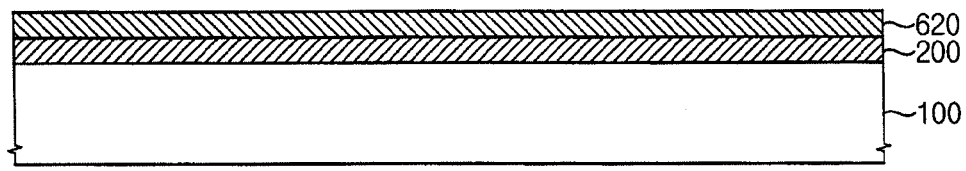

ORGANIC LIGHT EMITTING DISPLAY DEVICE AND METHOD OF MANUFACTURING THE SAME

CROSS-REFERENCE TO RELATED APPLICATION

Korean Patent Application No. 10-2013-0122637, filed on Oct. 15, 2013, in the Korean Intellectual Property Office, and entitled: "Organic Light Emitting Display Device And Method Of Manufacturing The Same," is incorporated by reference herein in its entirety.

BACKGROUND

1. Field

Embodiments relate generally to a display device including an organic light emitting display device and a method of manufacturing the same.

2. Description of the Related Art

An organic light emitting display (OLED) device displays images or characters by using light generated when holes and electrons provided from an anode and a cathode, respectively are combined with each other at an organic light emitting layer interposed between the anode and the cathode. The OLED device has been spotlighted as next-generation display devices as having various advantages such as a wide viewing angle, a rapid response speed, a thin thickness, a low power consumption, and the like.

SUMMARY

Embodiments are directed to an organic light emitting display device including a substrate, a display element on the substrate, and an encapsulation member on the substrate. The encapsulation member encapsulates the display element. The encapsulation member includes a plurality of organic layers and a plurality of inorganic layers. Each inorganic layer includes a plurality of inorganic blocks that are separate from each other. The inorganic layers are between the organic layers.

The inorganic blocks may increase a flexibility of the encapsulation member. The organic layers may include at least one of an epoxy resin, an acrylate resin, and a urethane acrylate resin. The inorganic layers may include at least one of silicon nitride, silicon oxide, copper oxide, iron oxide, titanium oxide, zinc selenium, and aluminum oxide.

The encapsulation member may include a first organic layer covering the substrate, a first inorganic layer, a second inorganic layer, and a second organic layer. The first inorganic layer may include a plurality of first inorganic blocks that are separate from each other. The first inorganic layer may be on the first organic layer. The second inorganic layer may include a plurality of second inorganic blocks that are separate from each other. The second inorganic blocks may contact the first inorganic blocks and exposed portions of the first organic layer. The second inorganic layer may be on the first inorganic layer. A second organic layer may cover the first inorganic layer and the second inorganic layer. The encapsulation member may further include a third inorganic layer including a plurality of third inorganic blocks that are separate from each other, the third inorganic blocks may contact the second inorganic blocks and exposed portions of the first inorganic layer, the third inorganic layer may be on the second inorganic layer.

The first inorganic blocks of the first inorganic layer may be arranged in a lattice shape, the second inorganic blocks of the second inorganic layer may be arranged in the lattice shape, and the third inorganic blocks of the third inorganic layer may be arranged in the lattice shape. The first inorganic blocks of the first inorganic layer may be arranged in a stripe shape, the second inorganic blocks of the second inorganic layer may be arranged in the stripe shape, and the third inorganic blocks of the third inorganic layer may be arranged in the stripe shape.

The encapsulation member may include a first organic layer covering the substrate, a first inorganic layer, a second organic layer, a second inorganic layer, and a third organic layer. The first inorganic layer may include a plurality of first inorganic blocks that are separate from each other. The first inorganic layer may be on the first organic layer. The second organic layer may include a plurality of second organic blocks that contact exposed portions of the first organic layer and that partially contact the first inorganic blocks. The second organic layer may be on the first inorganic layer. The second inorganic layer may include a plurality of second inorganic blocks that are separate from each other. The second inorganic blocks may contact adjacent exposed portions of the first inorganic blocks. The second inorganic layer may be on the second organic layer. The third organic layer may cover the second organic layer and the second inorganic layer.

The encapsulation member may further include a fourth organic layer and a third inorganic layer. The fourth organic layer may include a plurality of fourth organic blocks that contact exposed portions of the second organic layer and that may partially contact the second inorganic blocks. The fourth organic layer may be on the second inorganic layer. The third inorganic layer may include a plurality of third inorganic blocks that are separate from each other. The third inorganic blocks may contact adjacent exposed portions of the second inorganic blocks. The third inorganic layer may be on the fourth organic layer. The first inorganic blocks of the first inorganic layer may be arranged in a lattice shape, the second inorganic blocks of the second inorganic layer may be arranged in the lattice shape, and the third inorganic blocks of the third inorganic layer may be arranged in the lattice shape. The first inorganic blocks of the first inorganic layer may be arranged in a stripe shape, the second inorganic blocks of the second inorganic layer may be arranged in the stripe shape, and the third inorganic blocks of the third inorganic layer may be arranged in the stripe shape.

A method of manufacturing an OLED device is provided that may include the following. A display element may be on a substrate. An encapsulation member may be formed on the substrate to encapsulate the display element. Formation of the encapsulation member may include the following. A first organic layer may be formed on the substrate on which the display element is formed. A first inorganic layer including first inorganic blocks that are separate from each other may be formed. The first inorganic layer may be formed on the first organic layer. A second inorganic layer may be formed including second inorganic blocks that are separate from each other. The second inorganic blocks may contact the first inorganic blocks and exposed portions of the first organic layer. The second inorganic layer may be formed on the first inorganic layer. A second organic layer may be formed covering the first inorganic layer and the second inorganic layer.

Formation of the encapsulation member may further include forming a third inorganic layer including a plurality of third inorganic blocks that are separate from each other. The third inorganic blocks may contact the second inorganic blocks and exposed portion of the first inorganic layer. The third inorganic layer may be formed on the second inorganic layer. The first and the second organic layers may include at least one of an epoxy resin, an acrylate resin, and a urethane acrylate resin. The first through the third inorganic layers may include at least one of silicon nitride, silicon oxide, copper oxide, iron oxide, titanium oxide, zinc selenium, and aluminum oxide.

A method of manufacturing an organic light emitting display device is provided that may include the following. A display element may be formed on a substrate. An encapsulation member may be formed on the substrate to encapsulate the display element. Formation of the encapsulation member may include the following. A first organic layer may be formed on the substrate on which the display element is formed. A first inorganic layer may be formed including first inorganic blocks that are separate from each other. The first inorganic layer may be formed on the first organic layer. A second organic layer may be formed including a plurality of second organic blocks that contact exposed portions of the first organic layer and that partially contact the first inorganic blocks. The second organic layer may be formed on the first inorganic layer. A second inorganic layer may be formed including a plurality of second inorganic blocks that are separate from each other. The second inorganic blocks may contact adjacent exposed portions of the first inorganic blocks. The second inorganic layer may be formed on the second organic layer. A third organic layer may be formed covering the second organic layer and the second inorganic layer.

Formation of the encapsulation member may further include forming a first organic layer and a third inorganic layer. The fourth organic layer may be formed including a plurality of fourth organic blocks that contact exposed portion of the second organic layer and that partially contact the second inorganic blocks. The fourth organic layer may be formed on the second inorganic layer. A third inorganic layer may include a plurality of third inorganic blocks that are separate from each other. The third inorganic blocks may contact adjacent exposed portions of the second inorganic blocks. The third inorganic layer may be formed on the fourth organic layer.

The first through the fourth organic layers may include at least one of an epoxy resin, an acrylate resin, and a urethane acrylate resin. The first through the third inorganic layers include at least one of silicon nitride, silicon oxide, copper oxide, iron oxide, titanium oxide, zinc selenium, and aluminum oxide.

BRIEF DESCRIPTION OF THE DRAWINGS

Features will become apparent to those of skill in the art by describing in detail exemplary embodiments with reference to the attached drawings in which:

FIG. 8 illustrates a flowchart of a method of manufacturing an OLED device.

FIGS. 9A through 9E illustrate cross-sectional views of stages of the method of FIG. 8.

FIG. 13 illustrates a flowchart of a method of manufacturing an OLED device.

FIGS. 14A through 14E illustrate cross-sectional views of stages of the method of FIG. 13.

DETAILED DESCRIPTION

Figure 1:
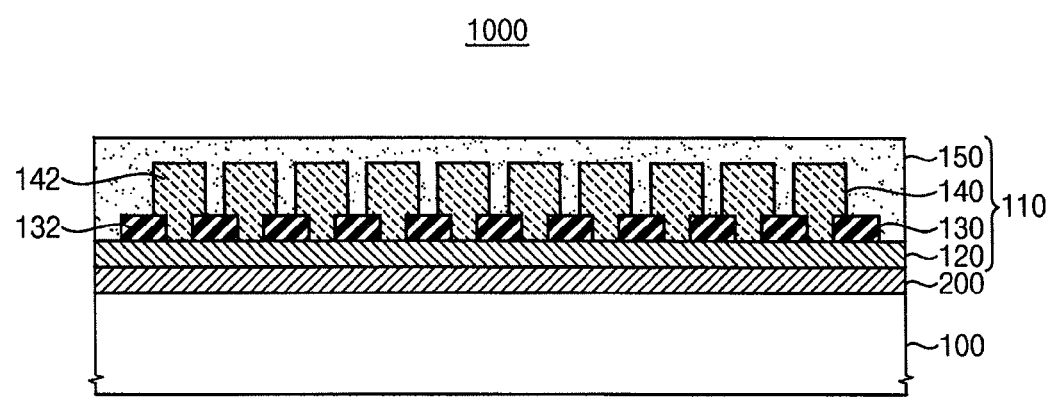
FIG. 1 illustrates a cross-sectional view of an OLED device.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

Although the terms first, second, third, and the like may be used herein to describe various elements, these elements are not limited by these terms. These terms are used to distinguish one element from another. A first element discussed could be termed a second element without departing from the teachings of the present disclosure. As used herein, the term "and/or" includes any and all combinations of one or more of the associated listed items. When an element is referred to as being "connected" or "coupled" to another element, it can be directly connected or coupled to the other element or intervening elements may be present. When an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," and the like).

The terminology used herein is for the purpose of describing particular example embodiments only and is not intended to be limiting. The singular forms "a," "an," and "the" are intended to include the plural forms as well, unless the context clearly indicates otherwise. The terms "comprises" and/or "comprising" specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this disclosure belongs. Terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of an OLED device. Referring to FIG. 1, the OLED device 1000 may include a substrate 100, a display element 200, and an encapsulation member 110. The encapsulation member 110 may be on the substrate 100. The substrate 100 may be a transparent insulation substrate. For example, the substrate 100 may be a flexible substrate, a glass substrate, a quartz substrate, a transparent plastic substrate, or the like. The display element 200 may be on the substrate 100. The encapsulation member 110 may include a first organic layer 120, a first inorganic layer 130, a second inorganic layer 140, and a second organic layer 150. The first inorganic layer 130 may include first inorganic blocks 132. The second inorganic layer 140 may include second inorganic blocks 142.

The first organic layer 120 that covers the substrate 100 and the display element 200 may be under the encapsulation member 110. For example, the first organic layer 120 may include an organic material such as epoxy resin, acrylate resin, urethane acrylate resin, or the like. The first organic layer 120 may relieve an internal stress of the first and the second inorganic layers 130 and 140, or may improve an effect of preventing moisture and oxygen penetration.

The first inorganic layer 130 may be on the first organic layer 120. The first inorganic layer 130 may include a plurality of first inorganic blocks 132. The first inorganic blocks 132 may have, for example, a rectangular shape, and may be separate from each other at a regular distance. The first organic layer 120 may be exposed between the first inorganic blocks 132. The first inorganic layer 130 may prevent or reduce oxygen and moisture penetration, and may improve a flexibility of the encapsulation member 110.

The second inorganic layer 140 may be on the first organic layer 120 and the first inorganic layer 130. The second inorganic layer 140 may include a plurality of second inorganic blocks 142. The second inorganic blocks 142 may contact the first inorganic blocks 132 and exposed portions of the first organic layer 120. The first inorganic blocks 132 may be exposed between the second inorganic blocks 142 as the second inorganic blocks 142 may be separate from each other at a regular distance. The second inorganic layer 140 may prevent or reduce the oxygen and moisture penetration, and may improve a flexibility of the encapsulation member 110. For example, the first inorganic layer 130 and the second inorganic layer 140 may include silicon nitride (e.g., $SiN_x$, $Si_aN_b$, or $Si_3N_4$), silicon oxide (e.g., $SiO_x$, $Si_aO_b$, SiO, or $SiO_2$), copper oxide (e.g., $CuO_x$, $Cu_aO_b$, CuO, or $Cu_2O$), iron oxide (e.g., $FeO_x$, $Fe_aO_b$, FeO, $Fe_2O_3$, or $Fe_3O_4$) titanium oxide (e.g., $TiO_x$, $Ti_aO_b$, or $TiO_2$), zinc selenium (e.g., ZnSe), and aluminum oxide (e.g., $AlO_x$, $Al_aO_b$, or $Al_2O_3$). The first inorganic layer 130 and the second inorganic layer 140 may include different materials to prevent the first inorganic layer 130 and the second inorganic layer 140 from combining with each other.

The second organic layer 150 may be on the first inorganic layer 130 and the second inorganic layer 140. The second organic layer 150 may prevent entry of outside moisture and oxygen by encapsulating the first inorganic layer 130 and the second inorganic layer 140. A material of the second organic layer 150 may be substantially the same as a material of the first organic layer 120. An operation or characteristic of the second organic layer 150 may be substantially the same as an operation or characteristic of the first organic layer 120.

The first and second inorganic layers 130 and 140 may have substantially the same thickness. The first and second inorganic layers 130 and 140 may have different thicknesses. The first and second organic layers 120 and 150 may have substantially the same thickness. The first and second organic layers 120 and 150 may have different thicknesses. Although it is illustrated in FIG. 1 that the encapsulation member 110 of the OLED device 1000 includes the first and second organic layers 120 and 150 and the first and second inorganic layers 130 and 140, for example, any suitable number of organic layers and inorganic layers may be used.

The encapsulation member 110 may improve the flexibility of the OLED device 1000 by forming the plurality of inorganic layers that include the plurality of inorganic blocks. The encapsulation member 110 may decrease a radius of limited curvature by dispersing a stress that may act on the encapsulation member 110, for example, when the substrate 100 is bent or curved. The encapsulation member 110 may prevent moisture and oxygen penetration by stacking of the plurality of organic layers and inorganic layers.

Figure 2:
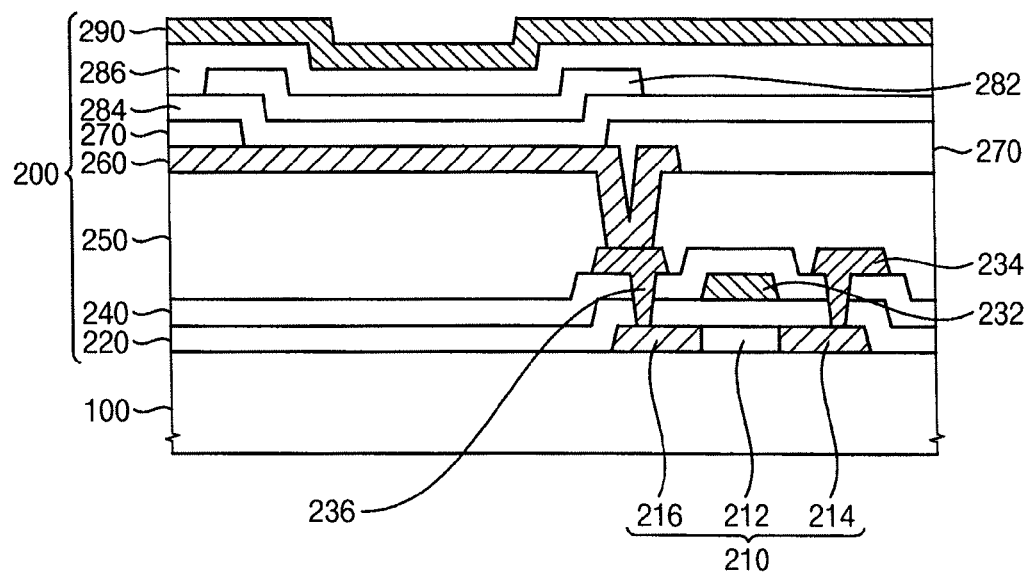
FIG. 2 illustrates a cross-sectional view of an example of a display element of the OLED device of FIG. 1.

FIG. 2 illustrates a cross-sectional view of an example of a display element of the OLED device of FIG. 1. Referring to FIG. 2, the display element 200 may include a switching member, a pixel electrode 260, a light emitting structure, and a common electrode 290. For example, as illustrated in FIG. 2, the OLED device may be a bottom emission type. The switching member may be on the substrate 100. The pixel electrode 260 may be on the switching member to be electrically coupled to the switching member. The light emitting structure may be between the pixel electrode 260 and the common electrode 290. The substrate 100 may be a transparent insulation substrate. For example, the substrate 100 may be a glass substrate, a transparent plastic substrate, or the like. The substrate 100 may be a flexible substrate. When a switching element in the switching member includes a thin film transistor, for example, the switching element may include a gate electrode 232, a source electrode 234, a drain electrode 236, a semiconductor layer 210, and the like.

A gate signal may be applied to the gate electrode 232. A data signal may be applied to the source electrode 234. The drain electrode 236 may be electrically coupled to the pixel electrode 260. The semiconductor layer 210 may be electrically coupled to the source electrode 234 and the drain electrode 236. The semiconductor layer 210 may be divided into a source region 214 to which the source electrode 234 may be coupled, a drain region 216 to which the drain electrode 236 may be coupled, and a channel region 212 that may be between the source region and the drain region. A gate insulation layer 220 may electrically isolate the semiconductor layer 210. A gate electrode 232 may be on the gate insulation layer 220. A first insulation layer 240 may be on the gate insulation layer 220 to cover the gate electrode 232.

As illustrated in FIG. 2, in the display element, the switching element including the thin film transistor may have a top gate structure in which the gate electrode 232 is over the semiconductor layer 210. Any suitable structure may be used for the switching element. For example, the switching element may have a bottom gate structure in which a gate electrode 232 is under the semiconductor layer 210. A second insulation layer 250 of the switching member may be on the first insulation layer 240 to cover the source electrode 234 and the drain electrode 236. The second insulation layer 250 may have a substantially flat surface.

As illustrated in FIG. 2, the light emitting structure may be obtained by forming a hole transfer layer (HTL) 284, by forming an organic light emitting layer (EL) 282, by forming an electron transfer layer (ETL) 286, or the like. The organic light emitting layer 282 may be formed using a light emitting material for generating a red color light, a green color light, and/or a blue color light. The organic light emitting layer 282 may be formed using a mixture of light emitting materials that generates lights having different wavelengths.

The pixel electrode 260 may be arranged between the switching member and the light emitting structure. The common electrode 290 may be arranged on the light emitting structure. A pixel defining layer 270 may be arranged between the switching member and the light emitting structure. The pixel defining layer 270 may be arranged in a region in which the pixel electrode 260 is not arranged. The organic light emitting layer 282 may be on the pixel electrode 260 to emit the light. The pixel electrode 260 may serve as an anode for providing holes into the hole transfer layer 284 of the light emitting structure, and the common electrode 290 may serve as a cathode for supplying electrons into the electron transfer layer 282. Depending on an emission type of the OLED, the pixel electrode 260 may be a transparent electrode or a semi-transparent electrode, and the common electrode 290 may be a reflective electrode. For example, the pixel electrode 260 may include a transparent conductive material including at least one of the following: indium zinc oxide (IZO), indium tin oxide (ITO), tin oxide (e.g., $SnO_x$, $SnO_2$, or SnO), zinc oxide (e.g., $ZnO_x$ or ZnO), and the like. The common electrode 290 may include a reflective material such as aluminum (Al), platinum (Pt), silver (Ag), chromium (Cr), tungsten (W), molybdenum (Mo), titanium (Ti), alloys thereof, and nitrides thereof.

The OLED device may include the encapsulation member 110 to encapsulate the display element 200 on the substrate 100. The encapsulation member 110 may include the first and the second organic layers 120 and 150 and the first and the second inorganic layers 130 and 140. The first inorganic layer 130 that includes the first inorganic blocks 132 and the second inorganic layer 140 that includes the second inorganic blocks 142 may improve the flexibility of the encapsulation member 110. The display element 200 may be effectively encapsulated (i.e., protected) from oxygen and moisture by the encapsulation member 110.

Figure 3:
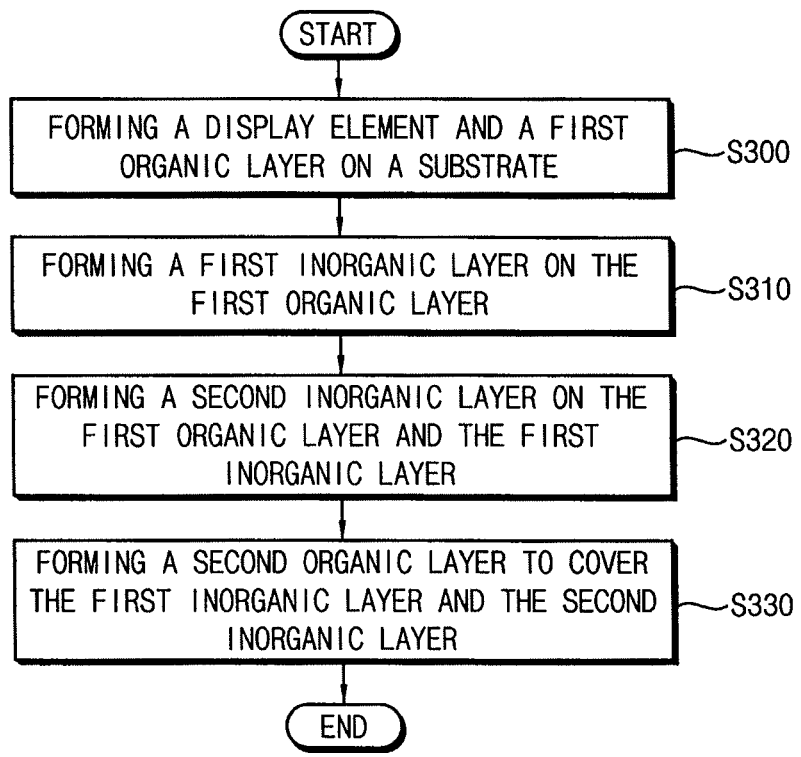
FIG. 3 illustrates a flowchart of stages of a method of manufacturing an OLED device.

FIG. 3 illustrates a flowchart of a method of manufacturing an OLED device and FIGS. 4A through 4D illustrate cross-sectional views of stages of the method of FIG. 3. Referring to FIG. 3, the method of FIG. 3 may form the display element and the first organic layer that covers the display element (S300), and may form the first inorganic layer on the first organic layer (S310). The method of FIG. 3 may form the second inorganic layer on the first organic layer and the first inorganic layer (S320), and may form the second organic layer covering the first inorganic layer and the second inorganic layer (S330).

Figure 4A:
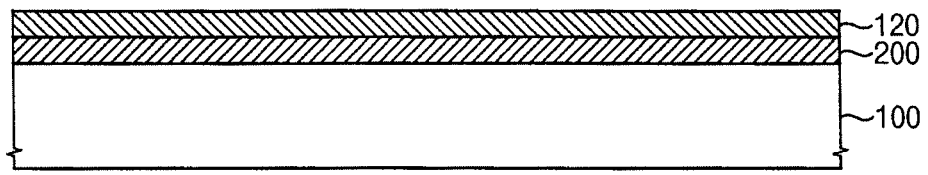
FIGS. 4A through 4D illustrate cross-sectional views of the method of FIG. 3.

Referring to FIG. 4A, the first organic layer 120 may cover the display element 200 on the substrate 100. The substrate 100 may be a transparent insulation substrate. The substrate 100 may be any suitable substrate, for example, a flexible substrate, a glass substrate, a quartz substrate, a transparent plastic substrate, or the like. The display element 200 may be on the substrate 100. The display element 200 may be substantially the same as the display element 200 described in FIG. 2. The first organic layer 120 may be on the display element 200. The first organic layer 120 may be formed by a spin coating process, a printing process, a chemical vapor deposition (CVD) process, or the like using organic materials such as epoxy resin, acrylate resin, urethane acrylate resin, or the like.

Figure 4B:
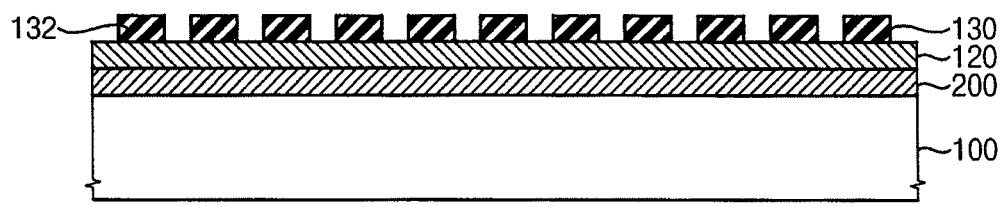

Referring to FIG. 4B, the first inorganic layer 130 may be formed on the first organic layer 120. The first inorganic layer 130 may be formed by a chemical vapor deposition process, a sputtering process, an atomic layer deposition (ALD) process, a plasma enhanced chemical vapor deposition (PECVD) process, or the like using aluminum oxide ($AlO_x$), silicon oxide ($SiO_x$), or the like. The first inorganic layer 130 may be patterned to include the plurality of first inorganic blocks 132. A photoresist film may be formed on the first inorganic layer 130, the photoresist film may be patterned by an exposure process and a photo process, and the plurality of inorganic blocks 132 may be formed by etching the first inorganic layer 130 using an etch mask.

Figure 4C:
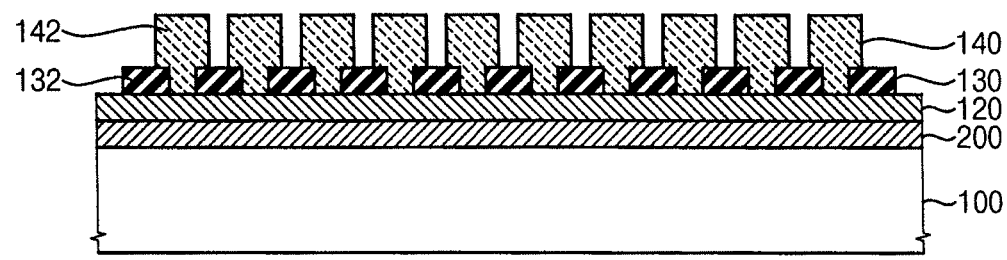
Figure 4D:
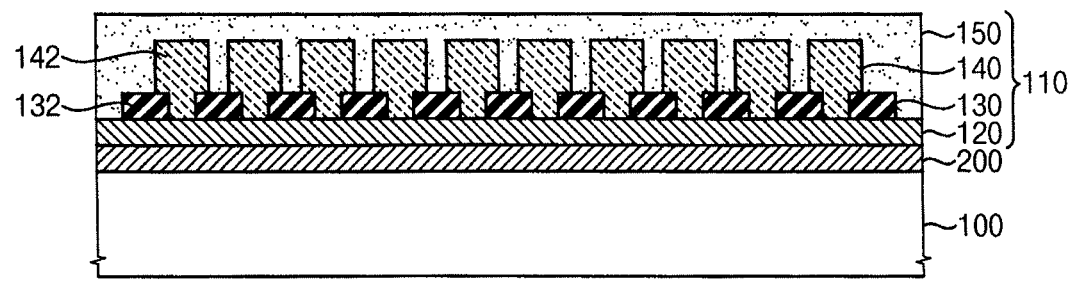

Referring to FIG. 4C, the second inorganic layer 140 may be on the first organic layer 120 and the first inorganic layer 130. The second inorganic layer 140 may be patterned to include the plurality of second inorganic blocks 142. A process for depositing the second inorganic layer 140 and patterning the second inorganic layer 140 into the plurality of second inorganic blocks 142 may be substantially the same as the described process referring to FIG. 4B. Referring to FIG. 4D, the second organic layer 150 may be on the first inorganic layer 130 and the second inorganic layer 140. A process for forming the second organic layer 150 may be substantially the same as the described process referring to FIG. 4A. The encapsulation member 110 of the OLED device may improve the flexibility of the OLED device by forming inorganic layers that include the plurality of inorganic blocks, and may prevent oxygen and moisture penetration into the display element 200 by stacking of organic layers and inorganic layers.

Figure 5A:
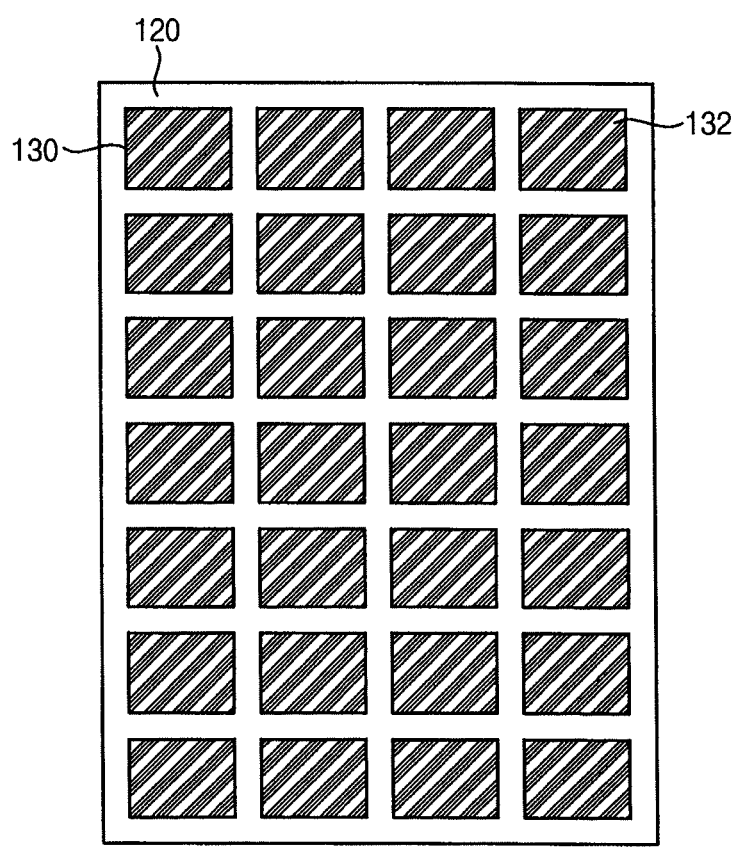
FIGS. 5A and 5B illustrate plan views of an example in which an encapsulation member is formed by the method of FIG. 3.
Figure 5B:
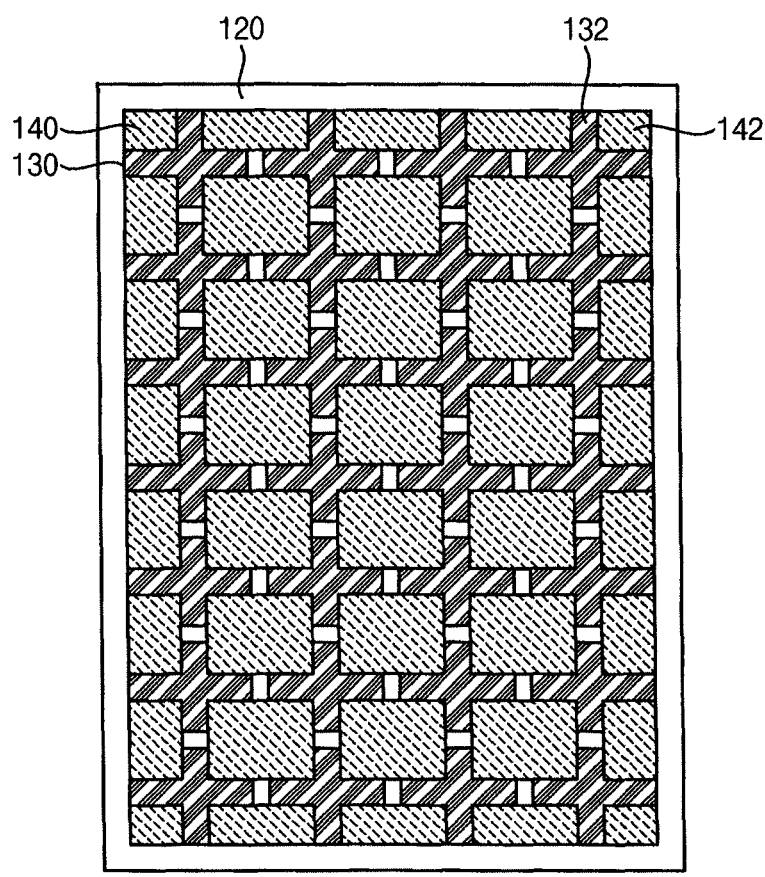

FIGS. 5A and 5B illustrate plan views of an example in which an encapsulation member is formed by the method of FIG. 3. FIGS. 5A and 5B illustrate examples of structures in which the first inorganic layer 130 and the second inorganic layer 140 are on the substrate 100. Referring to FIG. 5A, the first inorganic layer 130 may be formed on the first organic layer 120. As illustrated in FIG. 4B, the first inorganic layer 130 may include the plurality of first inorganic blocks 132 that are separate from each other at a regular distance. The first inorganic blocks 132 of the first inorganic layer 130 may be arranged in a lattice shape. Referring to FIG. 5B, the second inorganic layer 140 may be on the first organic layer 120 and the first inorganic layer 130. As illustrated in FIG. 4C, the second inorganic layer 140 may include the plurality of second inorganic blocks 142 that are separate from each other at a regular distance. The second inorganic blocks 142 of the second inorganic layer 140 may be arranged in the lattice shape while partially overlapping the first inorganic blocks 132 of the first inorganic layer 130.

When the OLED device is bent in any direction, for example, a stress delivered to the encapsulation member may be dispersed into the first and second inorganic blocks 132 and 142 as the first and second inorganic blocks 132 and 142 may be arranged in a lattice shape. When a flexible display device or a flat display device that includes the organic light emitting element is bent, for example, a crack of the encapsulation member may be prevented. Although the first and second inorganic layers 130 and 140 are depicted in FIGS. 5A and 5B, for example, the first organic layer 120 may be under the first inorganic layer 130, and the second organic layer 150 may be on the second inorganic layer 140.

Figure 6A:
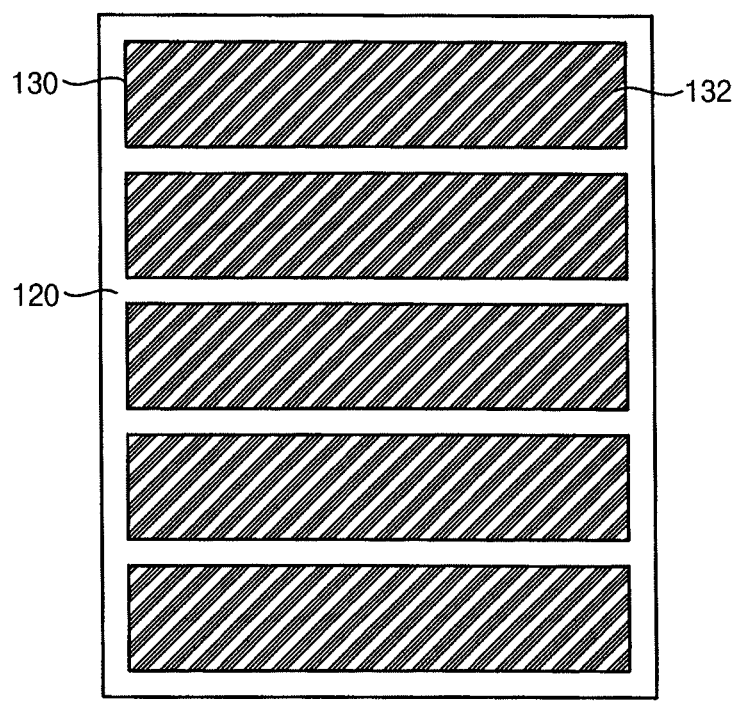
FIGS. 6A and 6B illustrate plan views of another example in which an encapsulation member is formed by the method of FIG. 3.
Figure 6B:
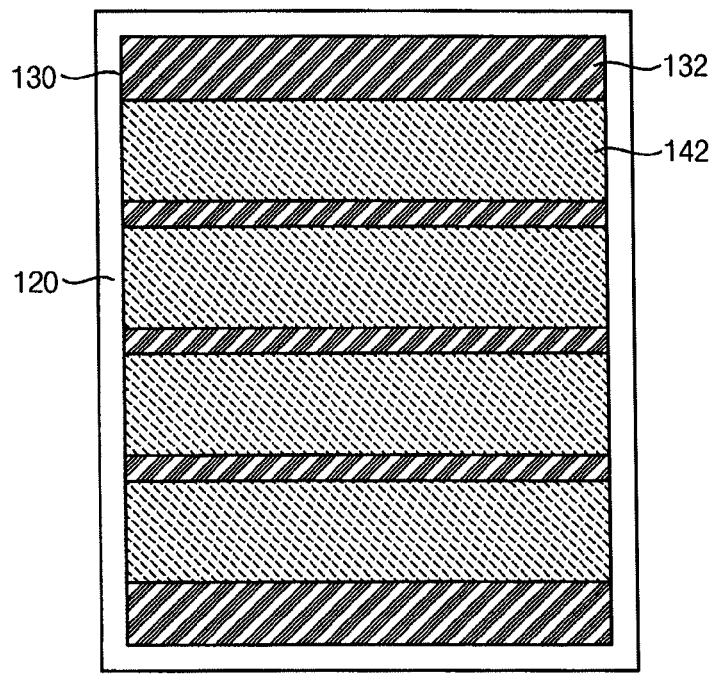

FIGS. 6A and 6B illustrate plan views of an example in which an encapsulation member may be formed by the method of FIG. 3. FIGS. 6A and 6B illustrate examples of structures in which the first inorganic layer 130 and the second inorganic layer 140 may be on the substrate 100. Referring to FIG. 6A, the first inorganic layer 130 may be on the first organic layer 120. As illustrated in FIG. 4B, the first inorganic layer 130 may include the plurality of first inorganic blocks 132 that are separate from each other at a regular distance. The first inorganic blocks 132 of the first inorganic layer 130 may be arranged in a stripe shape. Referring to FIG. 6B, the second inorganic layer 140 may be on the first organic layer 120 and the first inorganic layer 130. As illustrated in FIG. 4C, the second inorganic layer 140 may include the plurality of second inorganic blocks 142 that are separate from each other at a regular distance. The second inorganic blocks 142 of the second inorganic layer 140 may be arranged in the stripe shape while partially overlapping the first inorganic blocks 132 of the first inorganic layer 130.

When the OLED device is bent in any direction, for example, the stress delivered to the encapsulation member may be dispersed into the first and second inorganic blocks 132 and 142 as the first and second inorganic blocks 132 and 142 may be arranged in the stripe shape. When the flexible display device or the flat display device that includes the organic light emitting element is bent, for example, a crack of the encapsulation member may be prevented. Although the first and second inorganic layers 130 and 140 are depicted in FIGS. 6A and 6B, for example, the first organic layer 120 may be under the first inorganic layer 130, and the second organic layer 150 may be on the second inorganic layer 140.

Although it is illustrated in FIGS. 5A, 5B, 6A and 6B that the lattice shape of inorganic layers and the stripe shape of inorganic layers may be arranged all over the substrate, for example, in other implementations, other arrangements of inorganic layers may be used. For example, the inorganic layer that includes the plurality of inorganic blocks may be partially arranged in a predetermined region that is frequently bent on the substrate.

Figure 7:
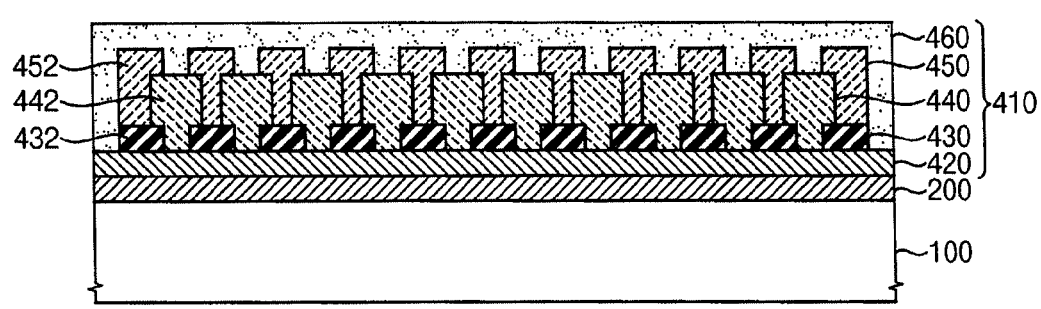
FIG. 7 illustrates a cross-sectional view of an OLED device according to another embodiment.

FIG. 7 illustrates a cross-sectional view of an OLED device according to another embodiment. The OLED device illustrated in FIG. 7 may be substantially the same as the described in FIG. 1 except that the third inorganic layer 450 may be additionally on the second inorganic layer 440 of the encapsulation member 410. Referring to FIG. 7, the OLED device 4000 may include a substrate 100, a display element 200, and an encapsulation member 410. The encapsulation member 410 may be on the substrate 100. The encapsulation member 410 may include a first organic layer 420, a first inorganic layer 430, a second inorganic layer 440, a third inorganic layer 450, and a second organic layer 460. The first inorganic layer 430 may include first inorganic blocks 432, the second inorganic layer 440 may include second inorganic blocks 442, and the third inorganic layer 450 may include third inorganic blocks 452.

The third inorganic layer 450 may be on the first inorganic layer 430 and the second inorganic layer 440. The third inorganic layer 450 may include a plurality of third inorganic blocks 452. The third inorganic blocks 452 may contact the second inorganic blocks 442 and exposed portions of the first inorganic blocks 432. The second inorganic blocks 442 may be exposed between the third inorganic blocks 452 as the third inorganic blocks 452 may be separate from each other at a regular distance. The third inorganic layer 450 may prevent or reduce oxygen and moisture penetration, and may improve a flexibility of the encapsulation member 410. For example, the first through third inorganic layers 430, 440 and 450 may include silicon nitride, silicon oxide, copper oxide, iron oxide, titanium oxide, zinc selenium, or aluminum oxide. The first through third inorganic layers 430, 440 and 450 may include different materials to prevent the first through third inorganic layers 430, 440 and 450 from combining each other. The first through third inorganic layers 430, 440 and 450 may have substantially the same thickness. The first through third inorganic layers 430, 440 and 450 may have different thicknesses.

Although it is illustrated in FIG. 7 that the encapsulation member 410 of the OLED device 4000 may include the first and second organic layers 420 and 460 and the first through third inorganic layers 430, 440 and 450, for example, any suitable number of organic layers and inorganic layers may be used. The encapsulation member 410 of the OLED device 4000 may effectively prevent or reduce moisture and oxygen penetration by additionally including the third inorganic layer 450.

FIG. 8 illustrates a flowchart of a method of manufacturing an OLED device and FIGS. 9A through 9E illustrate cross-sectional views of the method of FIG. 8. Referring to FIG. 8, the method of FIG. 8 may form the display element and the first organic layer that covers the display element (S500), may form the first inorganic layer on the first organic layer (S510), and may form the second inorganic layer on the first organic layer and the first inorganic layer (S520). The method of FIG. 8 may form the third inorganic layer on the first inorganic layer and the second inorganic layer (S530), and may form the second organic layer to cover the second inorganic layer and the third inorganic layer (S540).

Referring to FIG. 9A, the first organic layer 420 may cover the display element 200 on the substrate 100. The substrate 100 may be a transparent insulation substrate. The substrate 100 may include an suitable substrate, for example, a flexible substrate, a glass substrate, a quartz substrate, a transparent plastic substrate, or the like. The display element 200 may be on the substrate 100. The display element 200 may be substantially the same as the display element 200 described in FIG. 2. The first organic layer 420 may be on the display element 200. The first organic layer 420 may be formed by a spin coating process, a printing process, a chemical vapor deposition process, or the like using organic materials such as epoxy resin, acrylate resin, urethane acrylate resin, or the like.

Figure 9B:
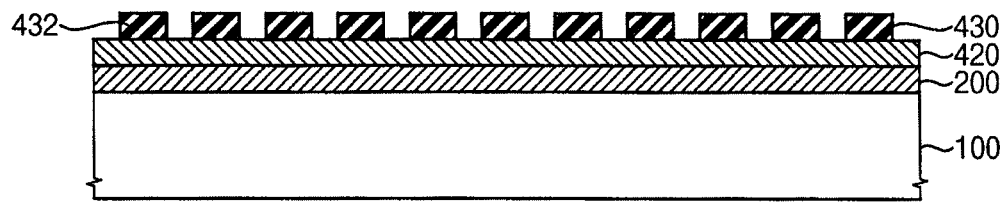

Referring to FIG. 9B, the first inorganic layer 430 may be on the first organic layer 420. The first inorganic layer 430 may be formed by a chemical vapor deposition process, a sputtering process, an atomic layer deposition process, a plasma enhanced chemical vapor deposition process, or the like using aluminum oxide, silicon oxide, or the like. The first inorganic layer 430 may be patterned to include the plurality of the first inorganic blocks 432. A photoresist film may be on the first inorganic layer 430. The photoresist film may be patterned by an exposure process and a photo process, and the plurality of inorganic blocks 432 may be formed by etching the first inorganic layer 430 using an etch mask.

Figure 9C:
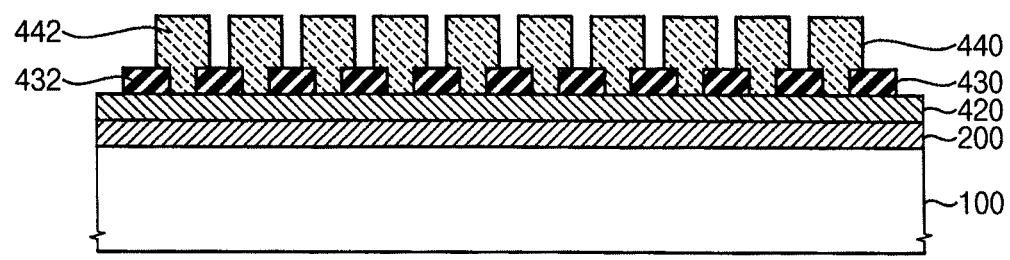

Referring to FIG. 9C, the second inorganic layer 440 may be on the first organic layer 420 and the first inorganic layer 430. The second inorganic layer 440 may be patterned to include the plurality of second inorganic blocks 442. A process for depositing the second inorganic layer 440 and patterning the second inorganic layer 440 into the plurality of second inorganic blocks 442 may be substantially the same as the described process referring to FIG. 9B.

Figure 9D:
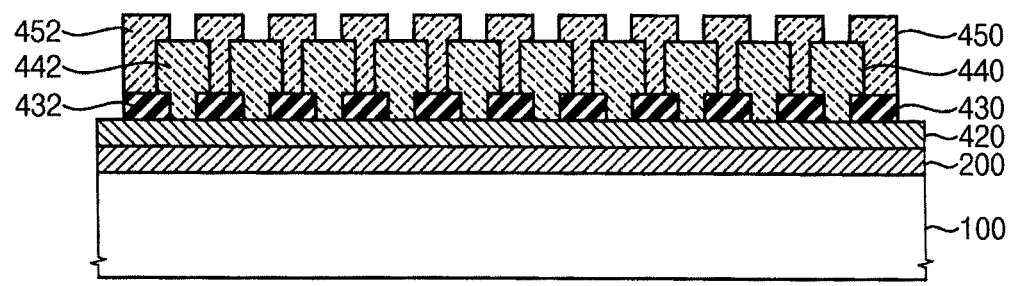

Referring to FIG. 9D, the third inorganic layer 450 may be on the first inorganic layer 430 and the second inorganic layer 440. The third inorganic layer 450 may be patterned to include the plurality of third inorganic blocks 452. A process for depositing the third inorganic layer 450 and patterning the third inorganic layer 450 into the plurality of third inorganic blocks 452 may be substantially the same as the described process referring to FIG. 9B.

Figure 9E:
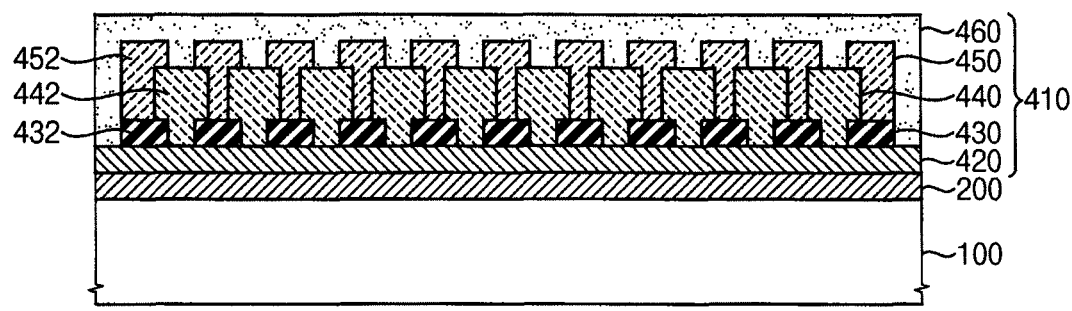

Referring to FIG. 9E, the second organic layer 460 may be on the second inorganic layer 440 and the third inorganic layer 450. A process for forming the second organic layer 460 may be substantially the same as the described process referring to FIG. 9A. The encapsulation member 410 of the OLED device may improve the flexibility of the OLED device by forming inorganic layers that include the plurality of inorganic blocks, and may prevent entry of oxygen and moisture penetration into the display element 200 by stacking of organic layers and inorganic layers.

Figure 10A:
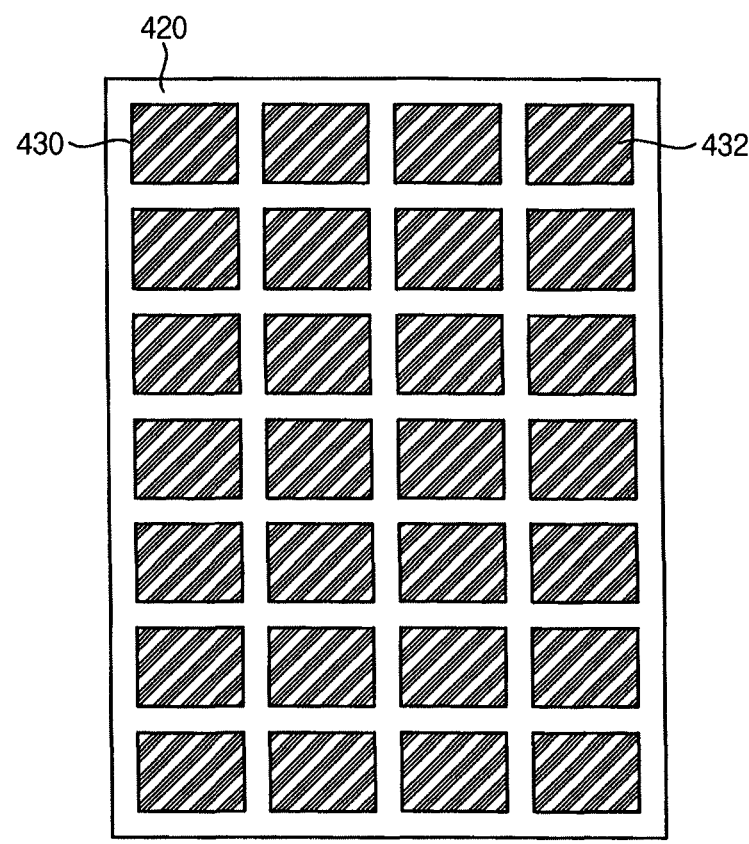
FIGS. 10A through 10C illustrate plan views of an example in which an encapsulation member is formed by the method of FIG. 8.
Figure 10B:
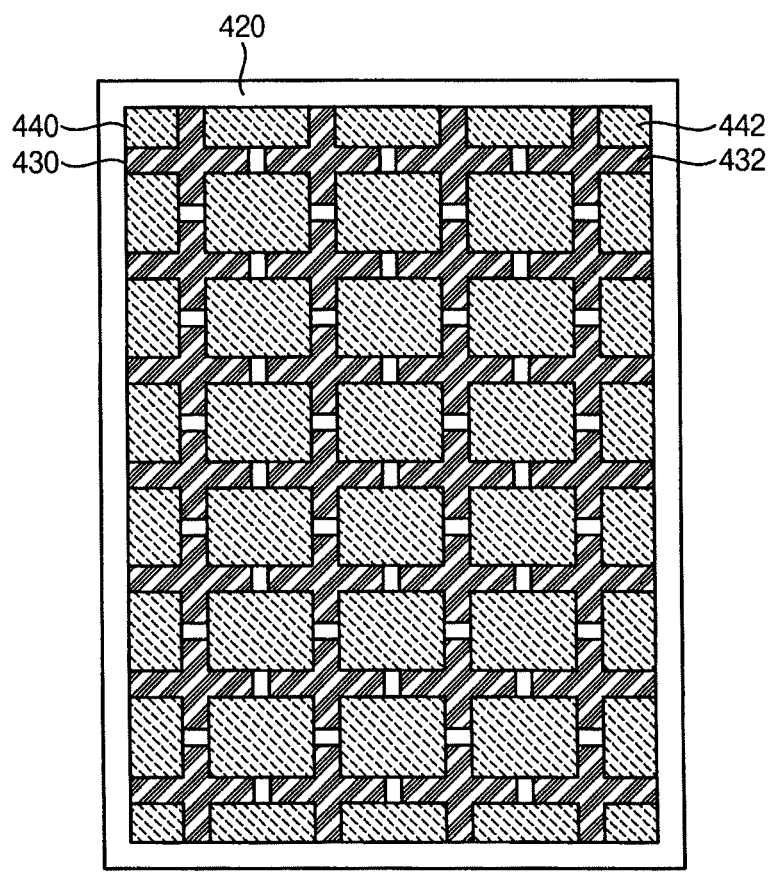
Figure 10C:
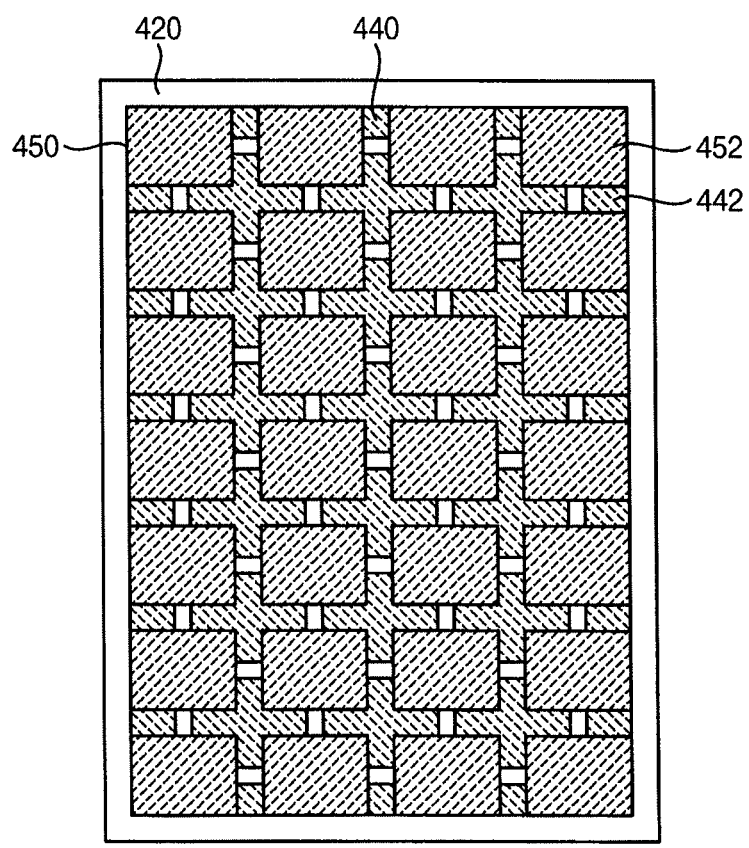

FIGS. 10A through 10C illustrate plan views of an example in which an encapsulation member may be formed by the method of FIG. 8. FIGS. 10A through 10C illustrate examples of structures in which the first inorganic layer 430, the second inorganic layer 440 and the third inorganic layer 450 may be on the substrate 100. Referring to FIG. 10A, the first inorganic layer 430 may be on the first organic layer 420. As illustrated in FIG. 9B, the first inorganic layer 430 may include the plurality of first inorganic blocks 432 that may be separate from each other at a regular distance. The first inorganic blocks 432 of the first inorganic layer 430 may be arranged in a lattice shape.

Referring to FIG. 10B, the second inorganic layer 440 may be on the first organic layer 420 and the first inorganic layer 430. As illustrated in FIG. 9C, the second inorganic layer 440 may include the plurality of second inorganic blocks 442 that may be separate from each other at a regular distance. The second inorganic blocks 442 of the second inorganic layer 440 may be arranged in the lattice shape while partially overlapping the first inorganic blocks 432 of the first inorganic layer 430.

Referring to FIG. 10C, the third inorganic layer 450 may be on the first inorganic layer 430 and the second inorganic layer 440. As illustrated in FIG. 9D, the third inorganic layer 450 may include the plurality of third inorganic blocks 452 that may be separate from each other at a regular distance. The third inorganic blocks 452 of the third inorganic layer 450 may be arranged in the lattice shape while partially overlapping the second inorganic blocks 442. A size of respective third inorganic blocks 452 may be substantially the same as a size of respective first inorganic blocks 432.

When the OLED device is bent in any direction, for example, a stress delivered to the encapsulation member may be dispersed into the first through third inorganic blocks 432, 442 and 452 as the first through third inorganic blocks 432, 442 and 452 may be arranged in the lattice shape. When a flexible display device or a flat display device that includes the organic light emitting element is bent, for example, a crack of the encapsulation member may be prevented. Although the first through third inorganic layers 430, 440 and 450 may be depicted in FIGS. 10A through 10C, for example, the first organic layer 420 may be under the first inorganic layer 430, and the second organic layer 460 may be on the third inorganic layer 450.

Figure 11A:
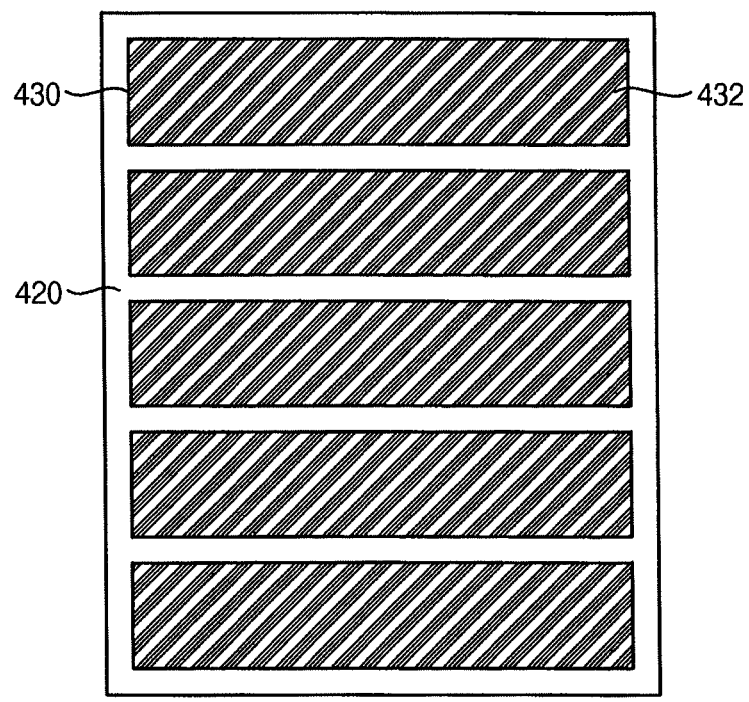
FIGS. 11A through 11C illustrate plan views of another example in which an encapsulation member is formed by the method of FIG. 8.
Figure 11B:
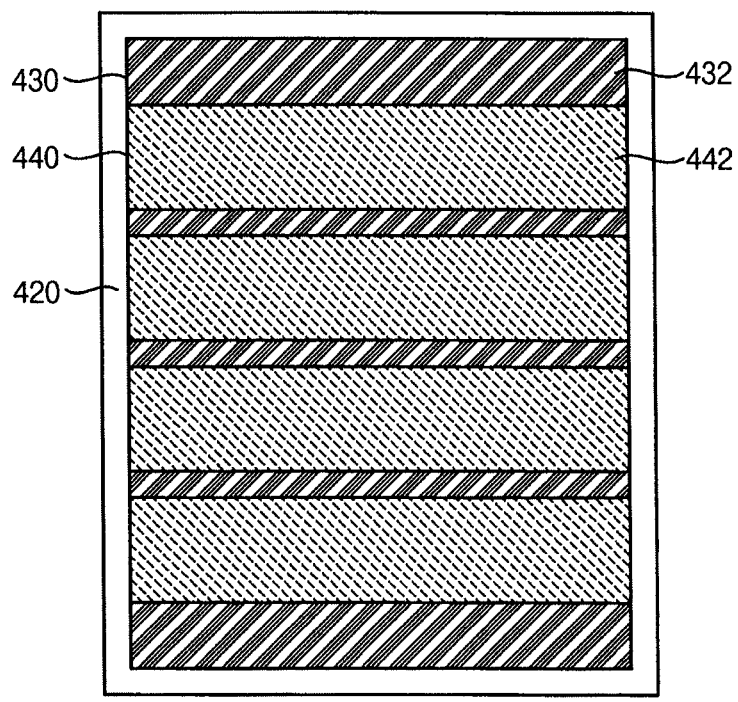
Figure 11C:
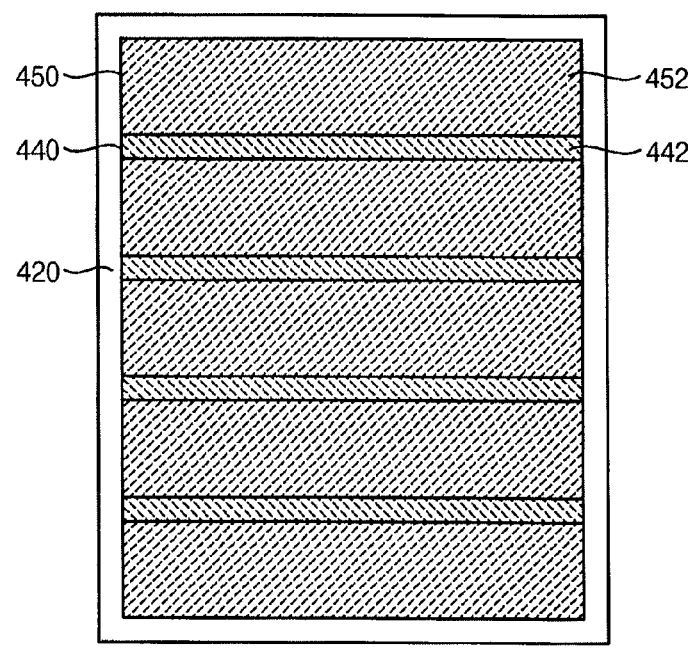

FIGS. 11A through 11C illustrate plan views of an example in which an encapsulation member may be formed by the method of FIG. 8. FIGS. 11A through 11C illustrate examples of structures in which the first inorganic layer 430, the second inorganic layer 440 and the third inorganic layer 450 may be on the substrate 100. Referring to FIG. 11A, the first inorganic layer 430 may be on the first organic layer 420. As illustrated in FIG. 9B, the first inorganic layer 430 may include the plurality of first inorganic blocks 432 that may be separate from each other at a regular distance. The first inorganic blocks 432 of the first inorganic layer 430 may be arranged in a stripe shape.

Referring to FIG. 11B, the second inorganic layer 440 may be on the first organic layer 420 and the first inorganic layer 430. As illustrated in FIG. 9C, the second inorganic layer 440 may include the plurality of second inorganic blocks 442 that may be separate from each other at a regular distance. The second inorganic blocks 442 of the second inorganic layer 440 may be arranged in a stripe shape while partially overlapping the first inorganic blocks 432 of the first inorganic layer 430.

Referring to FIG. 11C, the third inorganic layer 450 may be on the first inorganic layer 430 and the second inorganic layer 440. As illustrated in FIG. 9D, the third inorganic layer 450 may include the plurality of third inorganic blocks 452 that may be separate from each other at a regular distance. The third inorganic blocks 452 of the third inorganic layer 450 may be arranged in a stripe shape while partially overlapping the second inorganic blocks 442. A size of respective third inorganic blocks 452 may be substantially the same as a size of respective first inorganic blocks 432.

When the OLED device is bent in any direction, for example, the stress delivered to the encapsulation member may be dispersed into the first through third inorganic blocks 432, 442 and 452 as the first through third inorganic blocks 432, 442 and 452 may be arranged in a stripe shape. When a flexible display device or a flat display device that includes the organic light emitting element is bent, for example, a crack of the encapsulation member may be prevented. Although the first through third inorganic layers 430, 440 and 450 are depicted in FIGS. 11A through 11C, for example, the first organic layer 420 may be under the first inorganic layer 430, and the second organic layer 460 may be on the third inorganic layer 450.

Although it is illustrated in FIGS. 5A, 5B, 5C 6A, 6B and 6C that the lattice shape of inorganic layers and the stripe shape of inorganic layers may be arranged all over the substrate, for example, other arrangements of inorganic layers may be used. For example, the inorganic layer that includes the plurality of inorganic blocks may be partially arranged in a predetermined region that may be frequently bent on the substrate.

Figure 12:
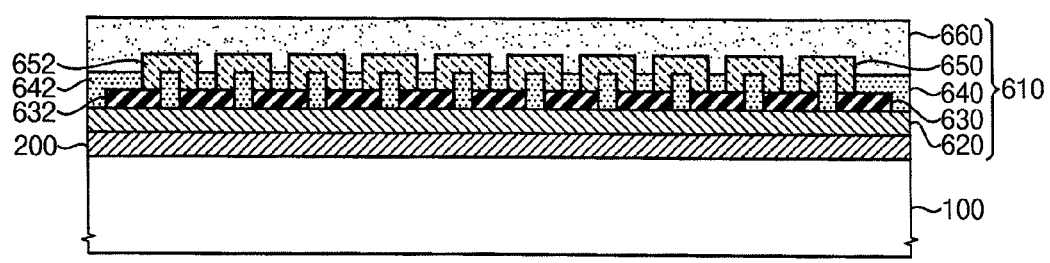
FIG. 12 illustrates a cross-sectional view of an OLED device according to another embodiment.

FIG. 12 illustrates a cross-sectional view of an OLED device according to another embodiment. Referring to FIG. 12, the OLED device 6000 may include a substrate 100, a display element 200 and an encapsulation member 610. The encapsulation member 610 may include a first organic layer 620, a first inorganic layer 630, a second organic layer 640, a second inorganic layer 650, and a third organic layer 660. The first inorganic layer 630 may include first inorganic blocks 632, and the second organic layer 640 may include second organic blocks 642. The second inorganic layer 650 may include second inorganic blocks 652.

The first organic layer 620 that covers the substrate 100 and the display element 200 may be under the encapsulation member 610. For example, the first organic layer 620 may include an organic material such as epoxy resin, acrylate resin, urethane acrylate resin, or the like. The first organic layer 620 may relieve an internal stress of the first and the second inorganic layers 630 and 650, or may improve an effect of preventing moisture and oxygen penetration.

The first inorganic layer 630 may be on the first organic layer 620. The first inorganic layer 630 may include a plurality of first inorganic blocks 632. The first inorganic blocks 632 may have, for example, a rectangular shape, and may be separate from each other at a regular distance. The first organic layer 620 may be exposed between the first inorganic blocks 632. The first inorganic layer 630 may prevent or reduce oxygen and moisture penetration, and may improve a flexibility of the encapsulation member 610. For example, the first inorganic layer 630 may include one or more of silicon nitride, silicon oxide, copper oxide, iron oxide, titanium oxide, zinc selenium, and aluminum oxide.

The second organic layer 640 may be on the first organic layer 620 and the first inorganic layer 630. The second organic layer 640 may include a plurality of second organic blocks 642. The second organic blocks 642 may contact exposed portions of the first organic layer 620 and partially contact the first inorganic blocks 632. The second organic blocks 642 on the first organic layer 620 and the second organic blocks 642 on the first inorganic blocks 632 may have different thicknesses from each other. The first inorganic blocks 632 may be exposed between the second organic blocks 642 as the second organic blocks 642 may be separate from each other at a regular distance.

The second inorganic layer 650 may be on the first inorganic layer 630 and the second organic layer 640, and the second inorganic layer 650 may include a plurality of second inorganic blocks 652. The second inorganic blocks 652 may contact adjacent exposed portions of the first inorganic blocks 632. The second organic blocks 642 may be exposed between the second inorganic blocks 652 as the second inorganic blocks 642 may be separate from each other at a regular distance. A material of the second inorganic layer 650 may be substantially the same as a material of the first inorganic layer 630. An operation or characteristic of the second inorganic layer 650 may be substantially the same as an operation or characteristic of the first inorganic layer 630.

The third organic layer 660 may cover the second organic layer 640 and the second inorganic layer 650. The third organic layer 660 may prevent entry of outside moisture and oxygen by encapsulating the second organic layer 640 and the second inorganic layer 650. A material of respective second and third organic layers 640 and 660 may be substantially the same as a material of the first organic layer 620. An operation or characteristic of respective second and third organic layers 640 and 660 may be substantially the same as an operation or characteristic of the first organic layer 620.

The first and second inorganic layers 630 and 650 may have substantially the same thickness. The first and second inorganic layers 630 and 650 may have different thicknesses. The first through the third organic layers 620, 640, and 660 may have substantially the same thickness. The first through the third organic layers 620, 640, and 660 may have different thicknesses. Although it is illustrated in FIG. 12 that the encapsulation member 610 of the OLED device 6000 includes the first through third organic layers 620, 640, and 660, and the first and second inorganic layers 630 and 650, for example, any suitable number of organic layers and inorganic layers may be used.

The encapsulation member 610 may improve the flexibility of the OLED device 6000 by forming the plurality of inorganic layers that include the plurality of inorganic blocks. The encapsulation member 610 may decrease a radius of limited curvature by dispersing a stress that acts on the encapsulation member 610, for example, when the substrate 100 is bent or curved. The encapsulation member 610 may prevent moisture and oxygen from penetration by stacking the plurality of organic layers and inorganic layers.

FIG. 13 illustrates a flowchart of a method of manufacturing an OLED device and FIGS. 14A through 14E illustrate cross-sectional views of the method of FIG. 13. Referring to FIG. 13, the method of FIG. 13 may form the display element and the first organic layer that covers the display element (S700), and may form the first inorganic layer on the first organic layer (S710). The method of FIG. 13 may form the second organic layer on the first organic layer and the first inorganic layer (S720), may form the second inorganic layer on the first inorganic layer and the second organic layer (S730), and may form the third organic layer on the second organic layer and the second inorganic layer (S740).

Referring to FIG. 14A, the first organic layer 620 may cover the display element 200 on the substrate 100. The substrate 100 may be a transparent insulation substrate. The substrate 100 may include any suitable substrate, for example, a flexible substrate, a glass substrate, a quartz substrate, a transparent plastic substrate, or the like. The display element 200 may be on the substrate 100. The display element 200 may be substantially the same as the display element 200 described in FIG. 2. The first organic layer 620 may be on the display element 200. The first organic layer 620 may be formed by a spin coating process, a printing process, a chemical vapor deposition process, or the like using organic materials such as epoxy resin, acrylate resin, urethane acrylate resin, or the like.

Figure 14B:
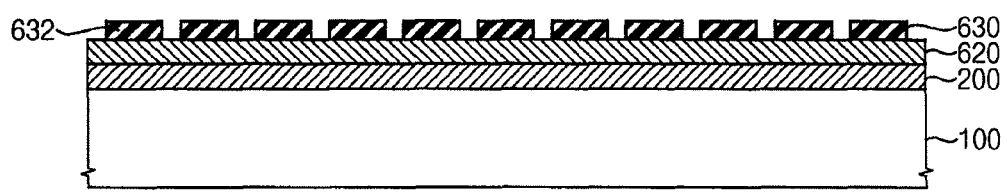

Referring to FIG. 14B, the first inorganic layer 630 may be on the first organic layer 620. The first inorganic layer 630 may be formed by a chemical vapor deposition process, a sputtering process, an atomic layer deposition process, a plasma enhanced chemical vapor deposition process, or the like using aluminum oxide, silicon oxide, or the like. The first inorganic layer 630 may be patterned to include the plurality of the first inorganic blocks 632. A photoresist film may be on the first inorganic layer 630, the photoresist film may be patterned by an exposure process and photo process, and the plurality of inorganic blocks 632 may be formed by etching the first inorganic layer 630 using an etch mask.

Figure 14C:
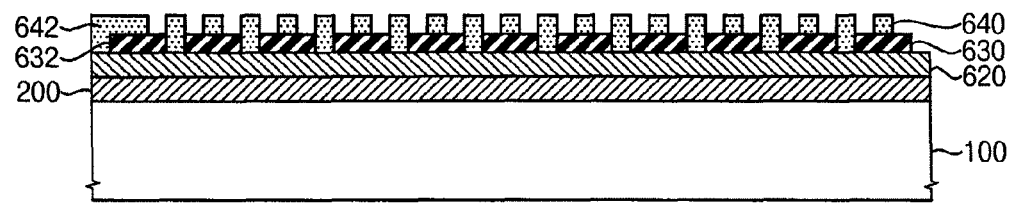

Referring to FIG. 14C, the second organic layer 640 may be on the first organic layer 620 and the first inorganic layer 630. A process for depositing the second organic layer 640 may be substantially the same as the described process referring to FIG. 14A. The second organic layer 640 may be patterned to include the plurality of second organic blocks 642. The second organic blocks 642 may contact exposed portions of the first organic layer 620 and may partially contact the first inorganic blocks 632.

Figure 14D:
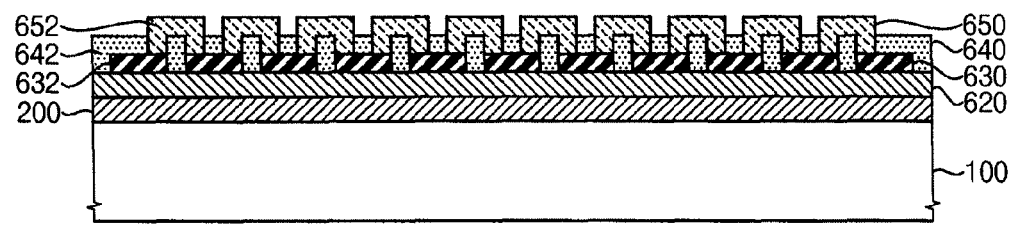

Referring to FIG. 14D, the second inorganic layer 650 may be on the first inorganic layer 630 and the second organic layer 640. The second inorganic layer 650 may be patterned to include the plurality of second inorganic blocks 652. A process for depositing the second inorganic layer 650 and patterning the second inorganic layer 650 into the plurality of second inorganic blocks 652 may be substantially the same as the described process referring to FIG. 14B. The second inorganic blocks 652 may contact adjacent exposed portions of the first inorganic blocks 632.

Figure 14E:
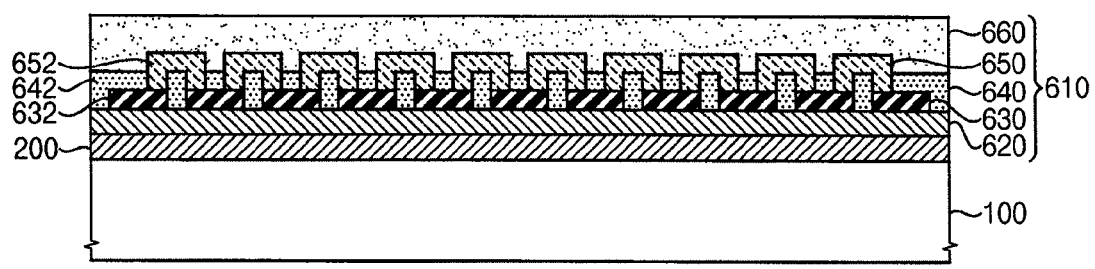

Referring to FIG. 14E, the third organic layer 660 may be on the second organic layer 640 and the second inorganic layer 650. A process for forming the third organic layer 660 may be substantially the same as the described process referring to FIG. 14A. The encapsulation member 610 of the OLED device may improve the flexibility of the OLED device by forming inorganic layers that include the plurality of inorganic blocks, and may prevent oxygen and moisture penetration into the display element 200 by stacking of organic layers and inorganic layers.

Figure 15A:
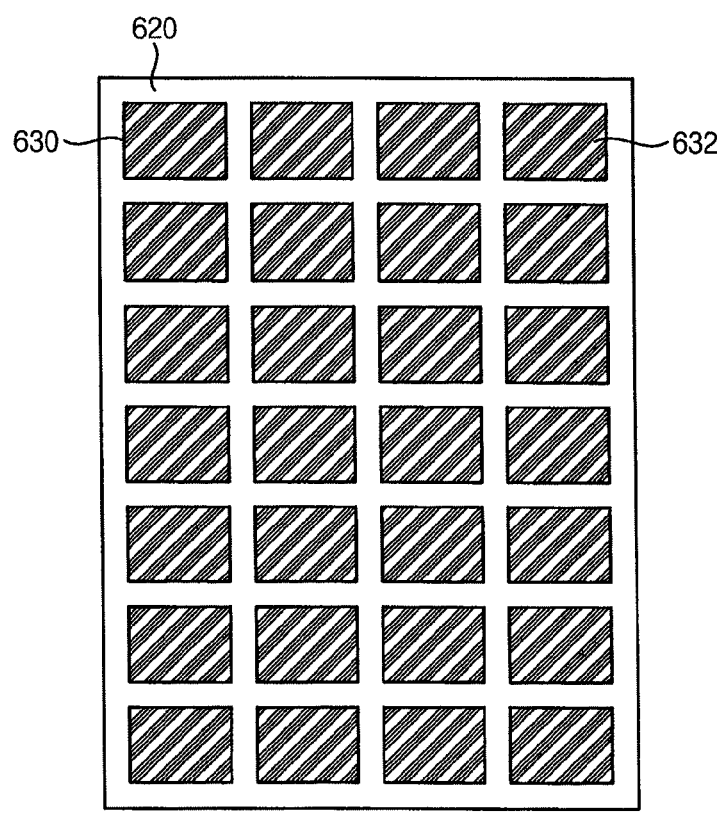
FIGS. 15A and 15B illustrate plan views of an example in which an encapsulation member is formed by the method of FIG. 13.
Figure 15B:
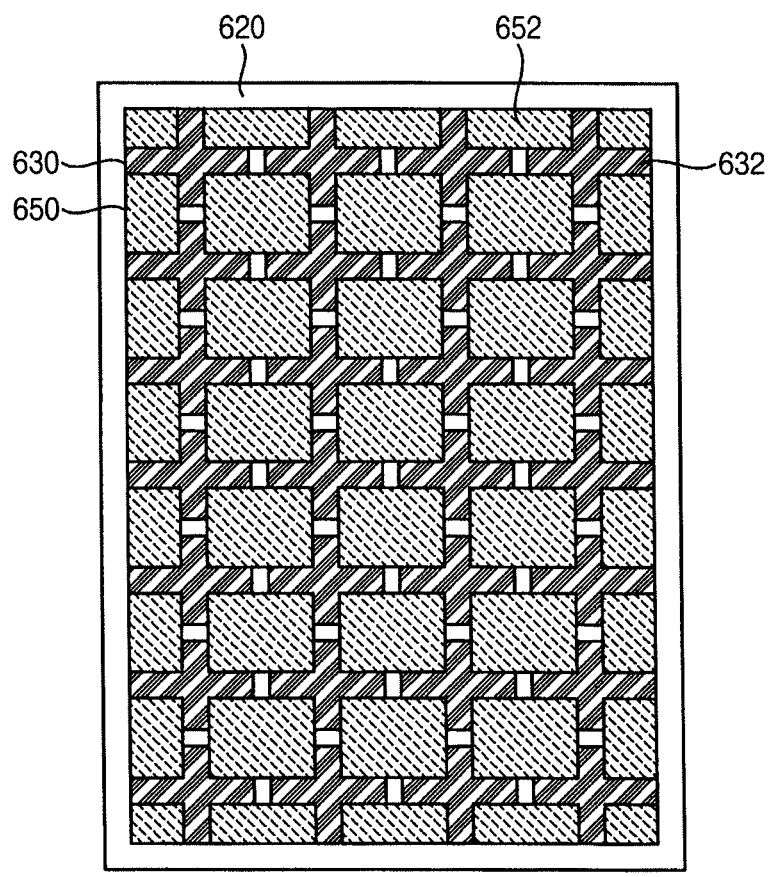

FIGS. 15A and 15B illustrate plan views of an example in which an encapsulation member may be formed by the method of FIG. 13. FIGS. 15A and 15B illustrate examples of structures in which the first inorganic layer 630 and the second inorganic layer 650 may be on the substrate 100. Referring to FIG. 15A, the first inorganic layer 630 may be on the first organic layer 620. As illustrated in FIG. 14B, the first inorganic layer 630 may include the plurality of first inorganic blocks 632 that may be separate from each other at a regular distance. The first inorganic blocks 632 of the first inorganic layer 630 may be arranged in a lattice shape. Referring to FIG. 15B, the second inorganic layer 650 may be on the first organic layer 620 and the first inorganic layer 630. As illustrated in FIG. 14D, the second inorganic layer 650 may include the plurality of second inorganic blocks 652 that may be separate from each other at a regular distance. The second inorganic blocks 652 of the second inorganic layer 650 may be arranged in the lattice shape while partially overlapping the first inorganic blocks 632 of the first inorganic layer 630.

When the OLED device is bent in any direction, for example, the stress delivered to the encapsulation member may be dispersed into the first and second inorganic blocks 632 and 652 as the first and second inorganic blocks 632 and 652 may be arranged in the lattice shape. When a flexible display device or a flat display device that includes the organic light emitting element is bent, for example, a crack of the encapsulation member may be prevented. Although the first and second inorganic layers 630 and 650 are depicted in FIGS. 15A and 15B, for example, the first organic layer 620 may be under the first inorganic layer 630, the second organic layer 640 may be between the first inorganic layer 630 and the second inorganic layer 650, and the third organic layer 660 may be on the second inorganic layer 650.

Figure 16A:
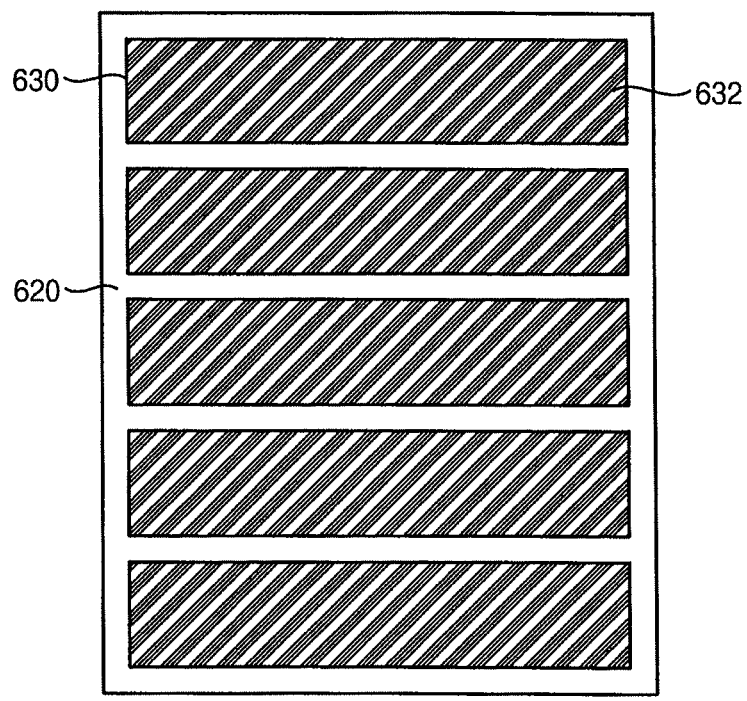
FIGS. 16A and 16B illustrate plan views of another example in which an encapsulation member is formed by the method of FIG. 13.
Figure 16B:
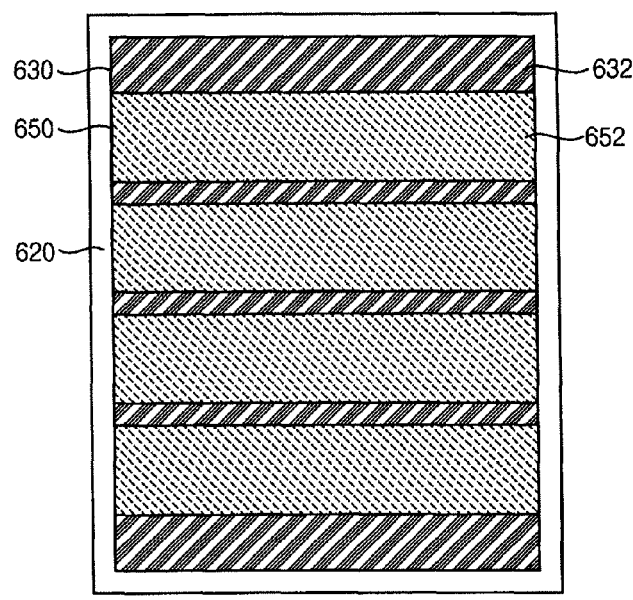

FIGS. 16A and 16B illustrate plan views of an example in which an encapsulation member may be formed by the method of FIG. 13. FIGS. 16A and 165B illustrate examples of structures that the first inorganic layer 630 and the second inorganic layer 650 may be on the substrate 100. Referring to FIG. 16A, the first inorganic layer 630 may be on the first organic layer 620. As illustrated in FIG. 14B, the first inorganic layer 630 may include the plurality of first inorganic blocks 632 that may be separate from each other at a regular distance. The first inorganic blocks 632 of the first inorganic layer 630 may be arranged in a stripe shape. Referring to FIG. 16B, the second inorganic layer 650 may be on the first organic layer 620 and the first inorganic layer 630. As illustrated in FIG. 14D, the second inorganic layer 650 may include the plurality of second inorganic blocks 652 that may be separate from each other at a regular distance. The second inorganic blocks 652 of the second inorganic layer 650 may be arranged in the stripe shape while partially overlapping the first inorganic blocks 632 of the first inorganic layer 630.

When the OLED device is bent in any direction, for example, the stress delivered to the encapsulation member may be dispersed into the first and second inorganic blocks 632 and 652 as the first and second inorganic blocks 632 and 652 may be arranged in the stripe shape. When a flexible display device or a flat display device that includes the organic light emitting element is bent, for example, a crack of the encapsulation member may be prevented. Although the first and second inorganic layers 630 and 650 are depicted in FIGS. 15A and 15B, for example, the first organic layer 620 may be under the first inorganic layer 630, the second organic layer 640 may be between the first inorganic layer 630 and the second inorganic layer 650, and the third organic layer 660 may be on the second inorganic layer 650.

Although it is illustrated in FIGS. 15A, 15B, 16A and 16B that the lattice shape of inorganic layers and the stripe shape of inorganic layers may be arranged all over the substrate, for example, other arrangements of inorganic layers may be used. For example, the inorganic layer that includes the plurality of inorganic blocks may be partially arranged in a predetermined region that may be frequently bent on the substrate.

Figure 17:
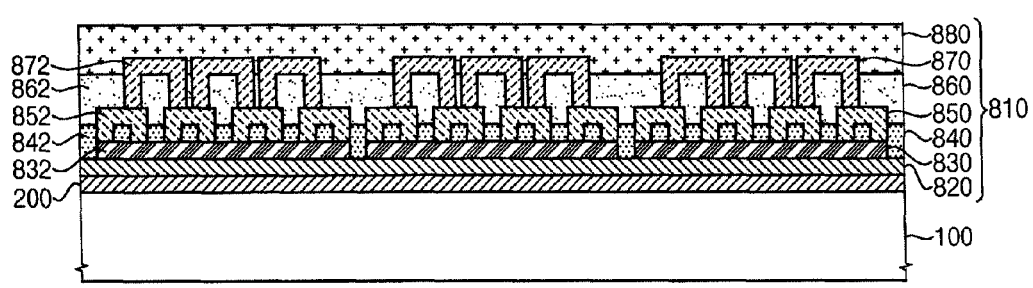
FIG. 17 illustrates a cross-sectional view of an OLED device according to another embodiment.

FIG. 17 illustrates a cross-sectional view of an OLED device. Referring to FIG. 17, the OLED device 8000 may include a substrate 100, a display element 200 and an encapsulation member 810. The encapsulation member 810 may include a first organic layer 820, a first inorganic layer 830, a second organic layer 840, a second inorganic layer 850, a third organic layer 860, a third inorganic layer 870 and a fourth organic layer 880. The first inorganic layer 830 may include first inorganic blocks 832, the second organic layer 840 may include second organic blocks 842, and the second inorganic layer 850 may include second inorganic blocks 852. The third organic layer 860 may include third organic blocks 862, and the third inorganic layer 870 may include third inorganic blocks 872.

The first organic layer 820 that covers the substrate 100 and the display element 200 may be under the encapsulation member 810. For example, the first organic layer 820 may include an organic material such as an epoxy resin, an acrylate resin, a urethane acrylate resin, or the like. The first organic layer 820 may relieve an internal stress of the first through the third inorganic layers 830, 850, and 870, or may improve an effect of preventing moisture and oxygen penetration.

The first inorganic layer 830 may be on the first organic layer 820. The first inorganic layer 830 may include a plurality of first inorganic blocks 832. The first inorganic blocks 832 may have, for example, a rectangular shape, and may be separate from each other at a regular distance. The first organic layer 820 may be exposed between the first inorganic blocks 832. The first inorganic layer 830 may prevent or reduce oxygen and moisture penetration, and may improve a flexibility of the encapsulation member 810. For example, the first inorganic layer 830 may include one or more of silicon nitride, silicon oxide, copper oxide, iron oxide, titanium oxide, zinc selenium and aluminum oxide.

The second organic layer 840 may be on the first organic layer 820 and the first inorganic layer 830. The second organic layer 840 may include a plurality of second organic blocks 842. The second organic blocks 842 may contact exposed portions of the first organic layer 820 and the first inorganic blocks 832. The second organic blocks 842 may be arranged at least one on the first inorganic blocks 832 as the second organic block 842 may be smaller than the first inorganic block 832. The second organic blocks 842 on the first organic layer 820 and the second organic blocks 842 on the first inorganic blocks 832 may have different thicknesses from each other. The first inorganic blocks 832 may be exposed between the second organic blocks 842 as the second organic blocks 842 may be separate from each other at a regular distance.

The second inorganic layer 850 may be on the first inorganic layer 830 and the second organic layer 840, and the second inorganic layer 850 may include a plurality of second inorganic blocks 852. The second inorganic blocks 852 may contact adjacent exposed portions of the first inorganic blocks 832. The second organic blocks 842 may be exposed between the second inorganic blocks 852 as the second inorganic blocks 852 may be separate from each other at a regular distance.

The third organic layer 860 may be on the second organic layer 840 and the second inorganic layer 850, and the third organic layer 860 may include a plurality of third organic blocks 862. The third organic blocks 862 may contact exposed portions of the second organic layer 840 and partially contact the second inorganic blocks 852.

The third inorganic layer 870 may be on the second inorganic layer 850 and the third organic layer 860, and the third inorganic layer 870 may include a plurality of third inorganic blocks 872 that may be separate from each other. The third inorganic blocks 872 may contact adjacent exposed portions of the second inorganic blocks 852. The third organic blocks 862 that may be on the second inorganic blocks 852 may be exposed between the third inorganic blocks 872 as the third inorganic block 872 may be separate from each other at a regular distance. A material of respective second inorganic layer 850 and third inorganic layer 870 may be substantially the same as a material of the first inorganic layer 830. An operation or characteristic of respective second inorganic layer 850 and third inorganic layer 870 may be substantially the same as an operation or characteristic of the first inorganic layer 830.

The fourth organic layer 880 may cover the third organic layer 860 and the third inorganic layer 870. The fourth organic layer 880 may prevent entry of outside moisture and oxygen by encapsulating the third organic layer 860 and the third inorganic layer 870. A material of respective second through fourth organic layer 840, 860 and 880 may be substantially the same as a material of the first organic layer 820. An operation or characteristic of respective second through fourth organic layer 840, 860, and 880 maybe substantially the same as an operation or characteristic of the first organic layer 820.

The first through third inorganic layer 830, 850, and 870 may have substantially the same thickness. The first through third inorganic layers 830, 850, and 870 may have different thicknesses. The first through fourth organic layers 820, 840, 860, and 880 may have substantially the same thickness. The first through fourth organic layers 820, 840, 860, and 880 may have the different thicknesses. Although it is illustrated in FIG. 17 that the encapsulation member 810 of the OLED device 8000 includes the first through fourth organic layers 820, 840, 860, and 880, and the first through third inorganic layers 830, 850, and 870, for example, any suitable number of organic layers and inorganic layers may be used.

The encapsulation member 810 may improve the flexibility of the OLED device 8000 by forming the plurality of inorganic layers that include the plurality of inorganic blocks. The encapsulation member 810 may decrease a radius of limited curvature by dispersing a stress that acts on the encapsulation member 810, for example, when the substrate 100 may be bent or curved. The encapsulation member 810 may prevent moisture and oxygen penetration by stacking of the plurality of organic layers and inorganic layers.

Figure 18:
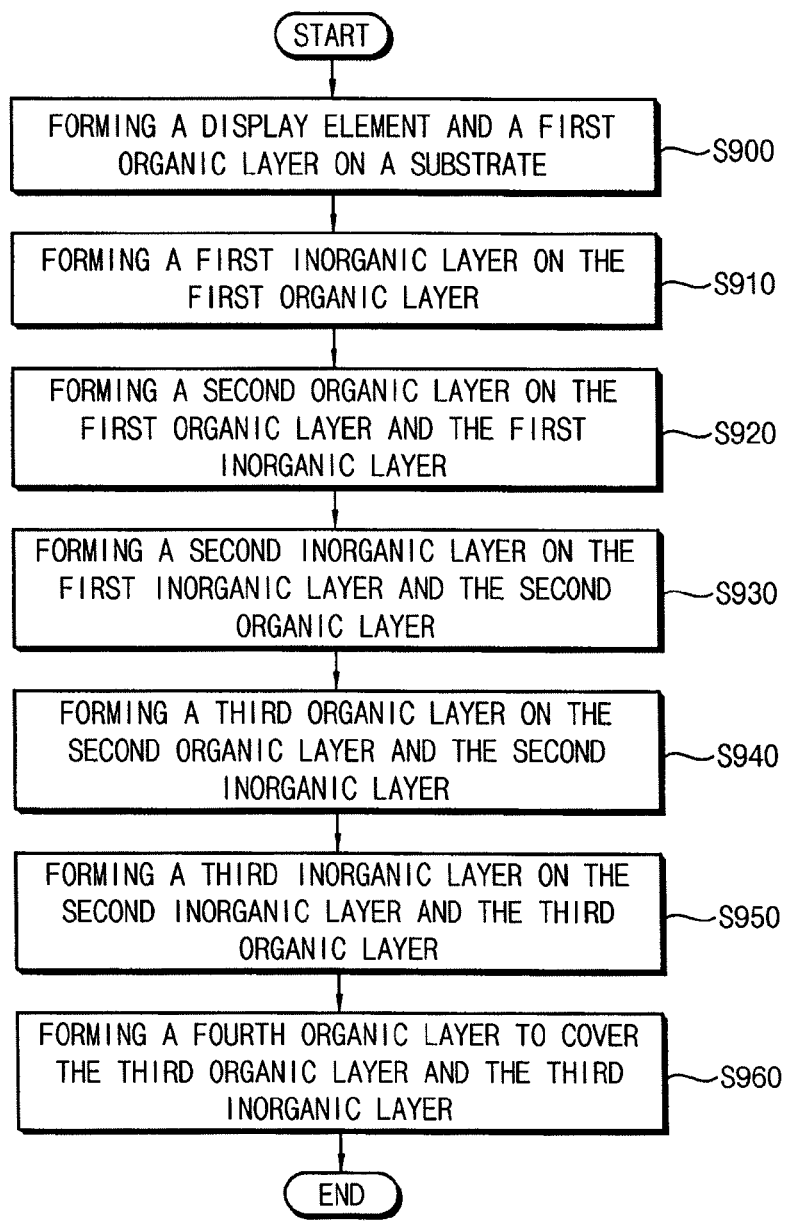
FIG. 18 illustrates a flowchart of a method of manufacturing an OLED device.

FIG. 18 illustrates a flowchart of a method of manufacturing an OLED device and FIGS. 19A through 19G illustrate cross-sectional views of the method of FIG. 18. Referring to FIG. 18, the method of FIG. 18 may form the display element and the first organic layer that covers the display element (S900), may form the first inorganic layer on the first organic layer (S910), and may form the second organic layer on the first organic layer and the first inorganic layer (S920). The method of FIG. 18 may form the second inorganic layer on the first inorganic layer and the second organic layer (S930), and may form the third organic layer on the second organic layer and the second inorganic layer (S940). The method of FIG. 18 may form the third inorganic layer on the second inorganic layer and the third organic layer (S950), and may form the fourth organic layer on the third organic layer and the third inorganic layer (S960).

Figure 19A:
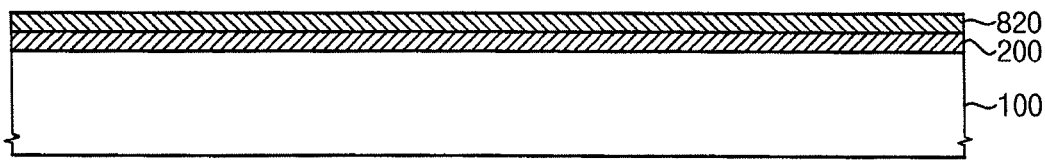
FIGS. 19A through 19G illustrate cross-sectional views of stages of the method of FIG. 18.

Referring to FIG. 19A, the first organic layer 820 may cover the display element 200 on the substrate 100. The substrate 100 may be a transparent insulation substrate. The substrate 100 may include any suitable substrate, for example, a flexible substrate, a glass substrate, a quartz substrate, a transparent plastic substrate, or the like. The display element 200 may be on the substrate 100. The display element 200 may be substantially the same as the display element 200 described in FIG. 2. The first organic layer 820 may be on the display element 200. The first organic layer 820 may be formed by a spin coating process, a printing process, a chemical vapor deposition process, or the like using organic materials such as epoxy resin, acrylate resin, urethane acrylate resin or the like.

Figure 19B:
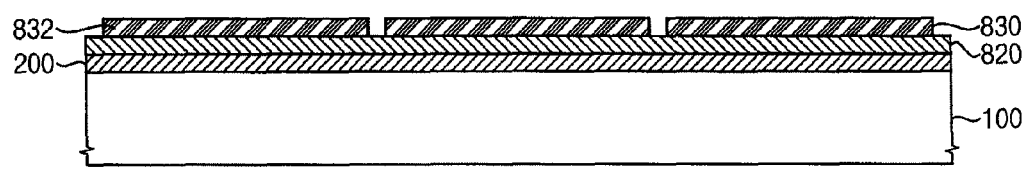

Referring to FIG. 19B, the first inorganic layer 830 may be on the first organic layer 820. The first inorganic layer 830 may be formed by a chemical vapor deposition process, a sputtering process, an atomic layer deposition process, a plasma enhanced chemical vapor deposition process or the like using aluminum oxide, silicon oxide, or the like. The first inorganic layer 830 may be patterned to include the plurality of the first inorganic blocks 832. A photoresist film may be on the first inorganic layer 830, the photoresist film may be patterned by an exposure process and photo process, and the plurality of inorganic blocks 832 may be formed by etching the first inorganic layer 830 using the etch mask.

Figure 19C:
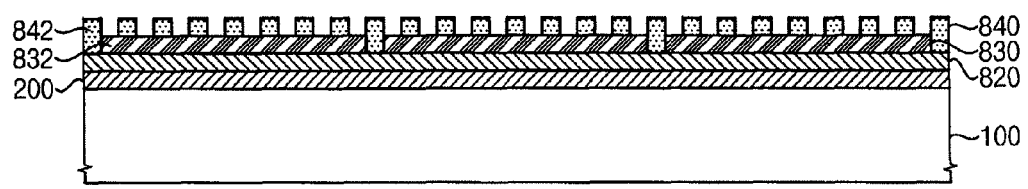

Referring to FIG. 19C, the second organic layer 840 may be on the first organic layer 820 and the first inorganic layer 830. A process for depositing the second organic layer 840 may be substantially the same as the described process referring to FIG. 19A. The second organic layer 840 may be patterned to include the plurality of second organic blocks 842. The second organic blocks 842 may be arranged at least one on the first inorganic blocks 832 because the second organic blocks 842 may be smaller than the first inorganic blocks 832. The second organic blocks 842 on the first organic layer 820 and the second organic blocks 842 on the first inorganic blocks 832 may have different thicknesses.

Figure 19D:
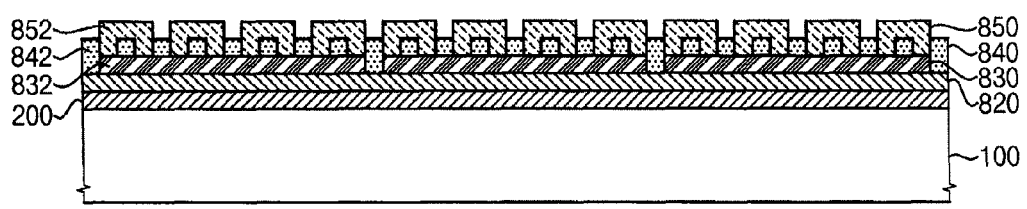

Referring to FIG. 19D, the second inorganic layer 850 may be on the first inorganic layer 830 and the second organic layer 840. The second inorganic layer 850 may be patterned to include the plurality of second inorganic blocks 852. A process for depositing the second inorganic layer 850 and patterning the second inorganic layer 850 into the plurality of second inorganic blocks 852 may be substantially the same as the described process referring to FIG. 19B. The second inorganic blocks 852 may contact exposed portions of the first inorganic blocks 832 between the second organic blocks 842.

Figure 19E:
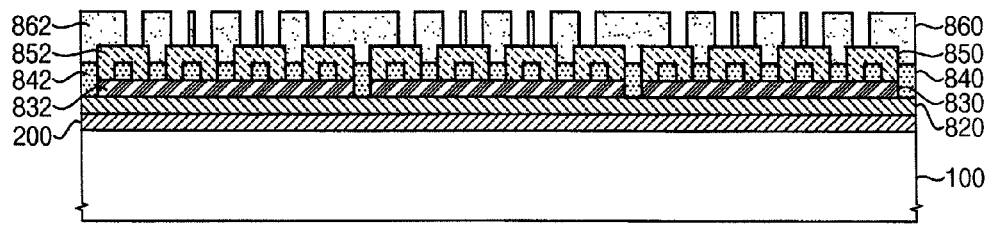

Referring to FIG. 19E, the third organic layer 860 may be on the second organic layer 840 and the second inorganic layer 850. A process for forming the third organic layer 860 may be substantially the same as the described process referring to FIG. 19A. The third organic layer 860 may be patterned to include the plurality of third organic blocks 862. The third organic blocks 862 may contact exposed portions of the second organic layer 840 and partially contact the second inorganic blocks 852.

Figure 19F:
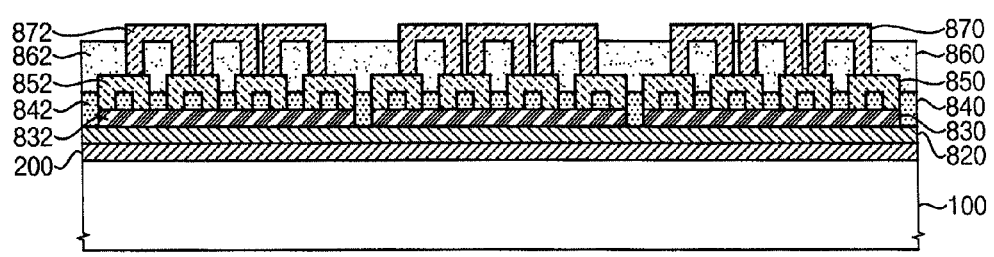

Referring to FIG. 19F, the third inorganic layer 870 may be on the second inorganic layer 850 and the third organic layer 860. The third inorganic layer 870 may be patterned to include the plurality of third inorganic blocks 852. A process for depositing the third inorganic layer 870 and patterning the third inorganic layer 870 into the plurality of third inorganic blocks 872 may be substantially the same as the described process referring to FIG. 19B. The third inorganic blocks 872 may contact adjacent exposed portions of the second inorganic blocks 852.

Figure 19G:
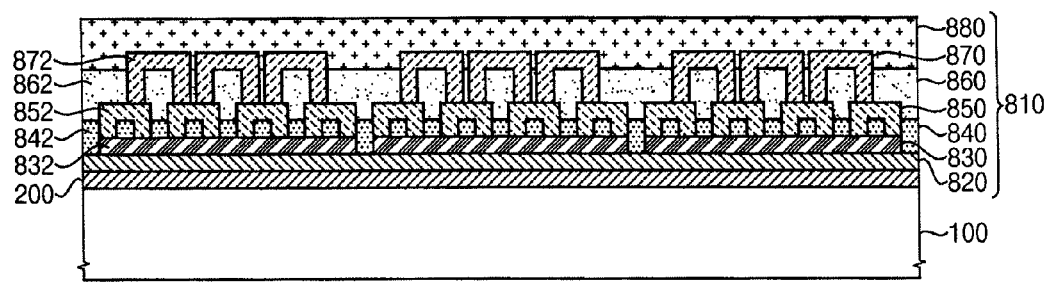

Referring to FIG. 19G, the fourth organic layer 880 may be on the third organic layer 860 and the third inorganic layer 870. A process for forming the fourth organic layer 880 may be substantially the same as the described process referring to FIG. 19A. The encapsulation member 810 of the OLED device may improve the flexibility of the OLED device by forming inorganic layers that include the plurality of inorganic blocks, and may prevent oxygen and moisture penetration into the display element 200 by stacking of organic layers and inorganic layers.

Figure 20A:
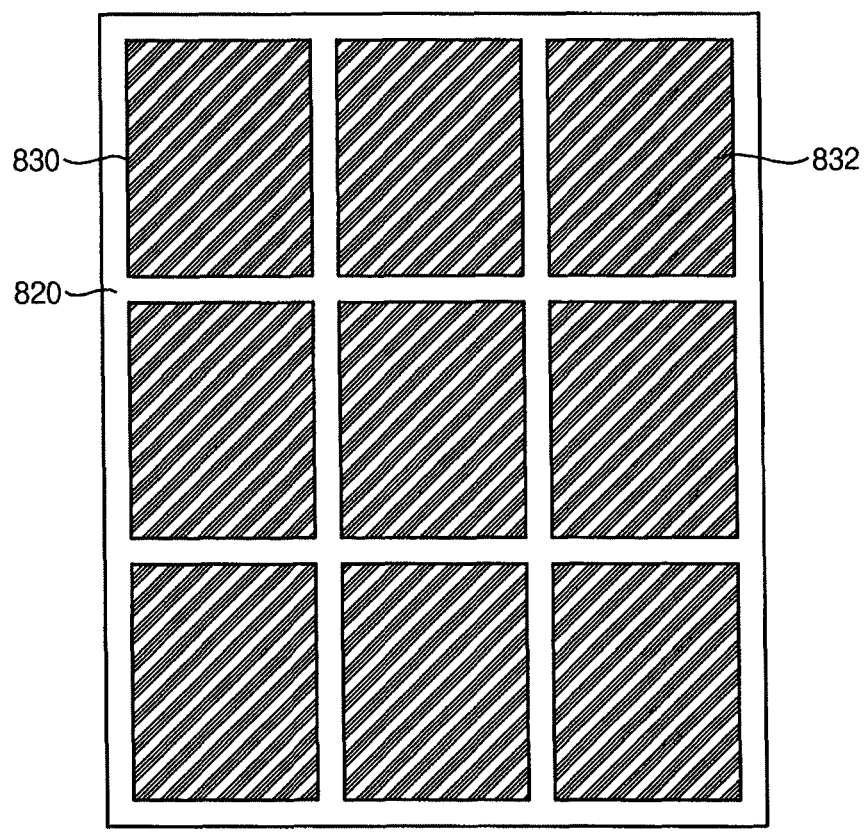
FIGS. 20A through 20C illustrate plan views of an example in which an encapsulation member is formed by the method of FIG. 18.
Figure 20B:
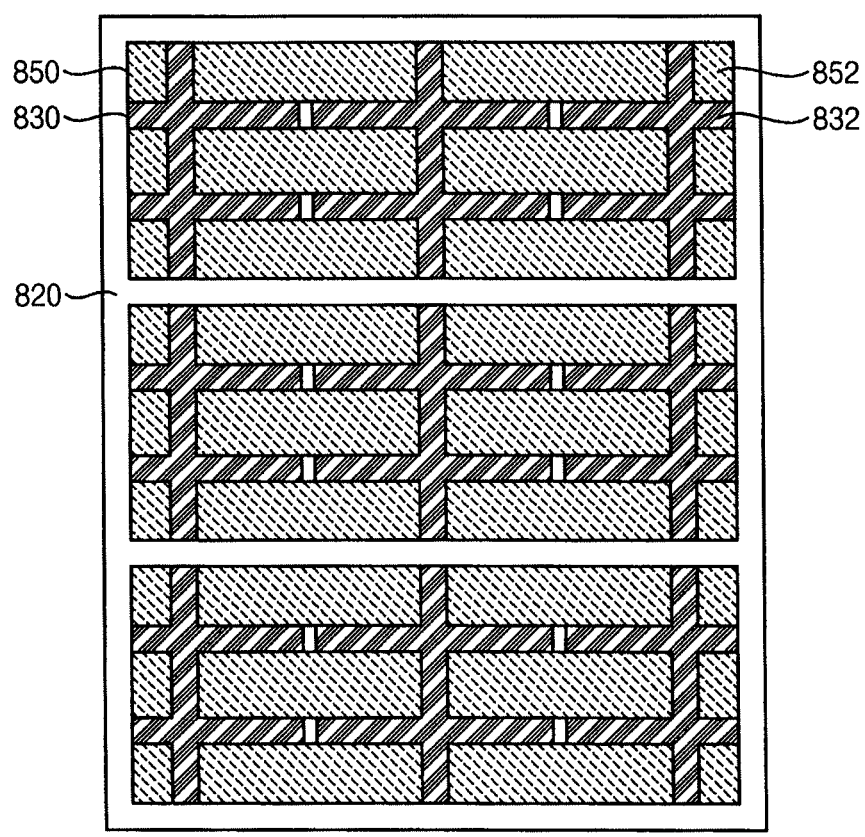
Figure 20C:
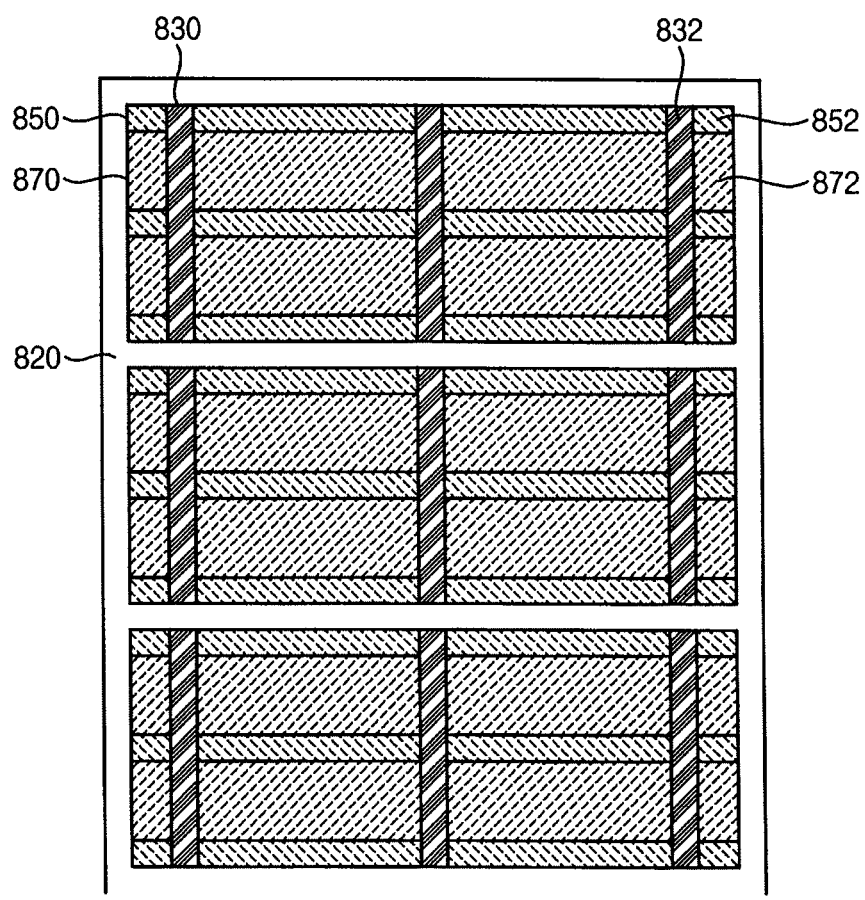

FIGS. 20A through 20C illustrate plan views of an example in which an encapsulation member may be formed by the method of FIG. 18. FIGS. 20A through 20C illustrate examples of structures in which the first through the third inorganic layer 830, 850 and 870 may be on the substrate 100. Referring to FIG. 20A, the first inorganic layer 830 may be on the first organic layer 820. As illustrated in FIG. 19B, the first inorganic layer 830 may include the plurality of first inorganic blocks 832 that may be separate from each other at a regular distance. The first inorganic blocks 832 of the first inorganic layer 830 may be arranged in a lattice shape.

Referring to FIG. 20B, the second inorganic layer 850 may be on the first organic layer 820 and the first inorganic layer 830. As illustrated in FIG. 9D, the second inorganic layer 850 may include the plurality of second inorganic blocks 852 that may be separate from each other at a regular distance. The second inorganic blocks 852 of the second inorganic layer 850 may be smaller than the first inorganic blocks 832 of the first inorganic layer 830. The second inorganic blocks 852 may be arranged in a lattice shape while partially overlapping the first inorganic blocks 832 of the first inorganic layer 830.

Referring to FIG. 20C, the third inorganic layer 870 may be on the first inorganic layer 830 and the second inorganic layer 850. As illustrated in FIG. 9F, the third inorganic layer 870 may include the plurality of third inorganic blocks 872 that may be separate from each other at a regular distance. The third inorganic blocks 872 of the third inorganic layer 870 may be arranged in a lattice shape while partially overlapping second inorganic blocks 852. A size of respective third inorganic blocks 872 may be substantially the same as a size of respective second inorganic blocks 852.

When the OLED device is bent in any direction, for example, a stress delivered to the encapsulation member may be dispersed into the first through third inorganic blocks 832, 852 and 872 as the first through third inorganic blocks 832, 852 and 872 may be arranged in the lattice shape. When a flexible display device or a flat display device that includes the organic light emitting element is bent, for example, a crack of the encapsulation member may be prevented. Although the first through third inorganic layers 830, 850 and 870 are depicted in FIGS. 20A through 20C, for example, the first organic layer 820 may be under the first inorganic layer 830, and the second organic layer 840 may be between the first inorganic layer 830 and the second inorganic layer 850. The third organic layer 860 may be between the second inorganic layer 850 and the third inorganic layer 870, and the fourth organic layer 880 may be on the third inorganic layer 870.

Figure 21A:
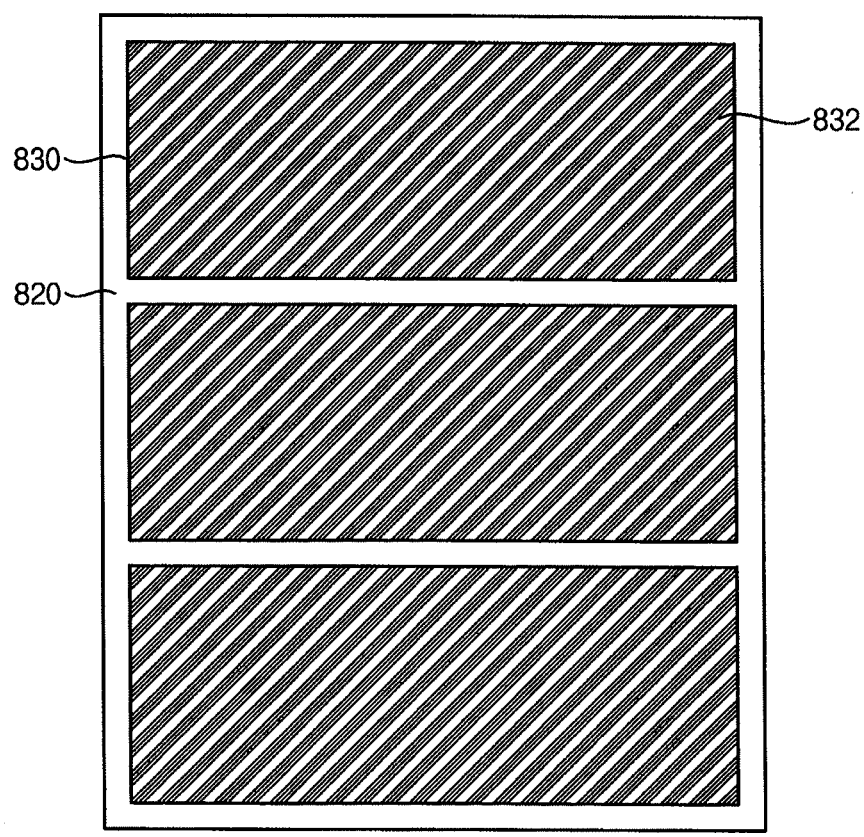
FIGS. 21A through 21C illustrate plan views of another example in which an encapsulation member is formed by the method of FIG. 18.
Figure 21B:
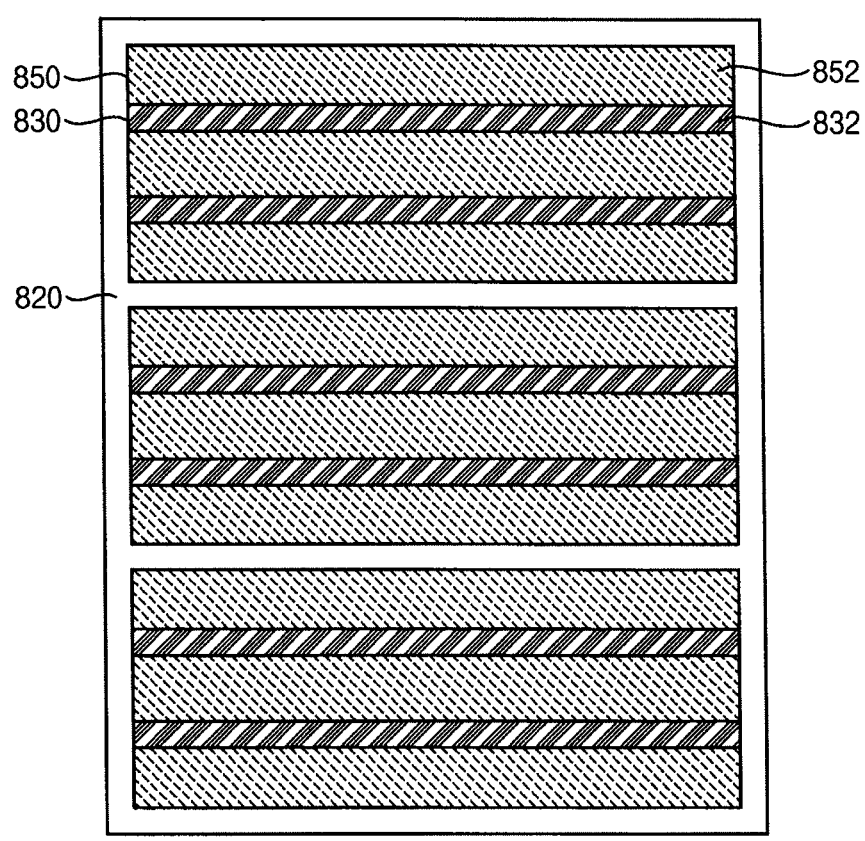
Figure 21C:
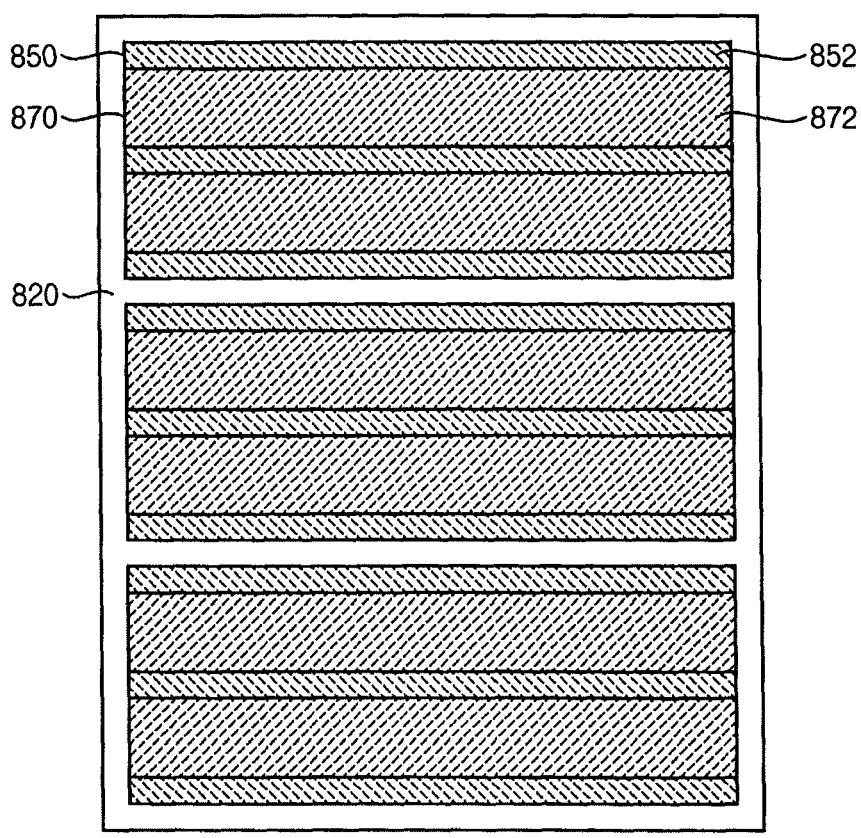

FIGS. 21A through 21C illustrate plan views of an example in which an encapsulation member may be formed by the method of FIG. 18. FIGS. 21A through 21C illustrate examples of structures in which the first through the third inorganic layer 830, 850 and 870 may be on the substrate 100. Referring to FIG. 21A, the first inorganic layer 830 may be on the first organic layer 820. As illustrated in FIG. 19B, the first inorganic layer 830 may include the plurality of first inorganic blocks 832 that may be separate from each other at a regular distance. The first inorganic blocks 832 of the first inorganic layer 830 may be arranged in a stripe shape.

Referring to FIG. 21B, the second inorganic layer 850 may be on the first organic layer 820 and the first inorganic layer 830. As illustrated in FIG. 19D, the second inorganic layer 850 may include the plurality of second inorganic blocks 852 that may be separate from each other at a regular distance. The second inorganic blocks 852 of the second inorganic layer 850 may be smaller than the first inorganic blocks 832 of the first inorganic layer 830. The second inorganic blocks 852 may be arranged in the stripe shape while partially overlapping the first inorganic blocks 832 of the first inorganic layer 830.

Referring to FIG. 21C, the third inorganic layer 870 may be on the first inorganic layer 830 and the second inorganic layer 850. As illustrated in FIG. 19F, the third inorganic layer 870 may include the plurality of third inorganic blocks 872 that may be separate from each other at a regular distance. The third inorganic blocks 872 of the third inorganic layer 870 may be arranged in a stripe shape while partially overlapping the second inorganic blocks 852. A size of respective third inorganic blocks 872 may be substantially the same as a size of respective second inorganic blocks 852.

When the OLED device is bent in any direction, for example, the stress delivered to the encapsulation member may be dispersed into the first through third inorganic blocks 832, 852 and 872 as the first through third inorganic blocks 832, 852 and 872 may be arranged in the stripe shape. When a flexible display device or a flat display device that includes the organic light emitting element is bent, for example, a crack of the encapsulation member may be prevented. Although the first through third inorganic layers 830, 850 and 870 may be depicted in FIGS. 21A through 21C, for example, the first organic layer 820 may be under the first inorganic layer 830, and the second organic layer 840 may be between the first inorganic layer 830 and the second inorganic layer 850. The third organic layer 860 may be between the second inorganic layer 850 and the third inorganic layer 870, and the fourth organic layer 880 may be on the third inorganic layer 870.

Although it is illustrated in FIGS. 20A, 20B, 20C, 21A, 21B and 21C that the lattice shape of inorganic layers and the stripe shape of inorganic layers may be arranged all over the substrate, for example, other arrangements of inorganic layers may be used. For example, the inorganic layer that includes the plurality of inorganic blocks may be partially arranged in a predetermined region that may be frequently bent on the substrate.

The present disclosure may be applied to an electronic device having an OLED device. For example, the devices and methods described herein may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, or the like.

By way of summation and review, an organic light emitting layer of the OLED device may be easily degraded by oxygen and/or moisture, so that the life span of the OLED device may be reduced. The OLED device may include an encapsulation member for protecting the organic light emitting layer from the external environment. An encapsulation member of an organic light emitting display device may be formed by stacking organic layers and inorganic layers. When the organic light emitting display device is bent or curved, an encapsulation member may be stressed, and a crack may occur in the encapsulation member.

As described herein, an OLED device having an encapsulation member that decreases a radius of curvature is provided. A method of manufacturing the OLED device is also provided. An OLED device may improve (i.e., decrease) a radius of limited curvature based on an encapsulation member that includes an inorganic layer having a plurality of inorganic blocks. A method of manufacturing an OLED device may improve a radius of limited curvature. An encapsulation member may improve the flexibility of an organic light emitting display device by forming a plurality of inorganic layers that include a plurality of inorganic blocks. The encapsulation member may decrease a radius of a limited curvature by dispersing a stress, which acts on the encapsulation member when a substrate is bent or curved.

Example embodiments have been disclosed herein, and although specific terms may be employed, they may be used and may be to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light emitting display device, comprising:
    a substrate;
    a display element on the substrate; and
    an encapsulation member on the substrate, the encapsulation member encapsulating the display element, the encapsulation member including a plurality of organic layers and a plurality of inorganic layers, wherein,
    the plurality of inorganic layers includes a first inorganic layer and a second inorganic layer,
    the first inorganic layer includes a plurality of first inorganic blocks that are spaced apart from each other, and
    the second inorganic layer is on the first inorganic layer and includes a plurality of second inorganic blocks that are spaced apart from each other, the second inorganic blocks contacting and filling spaces between the first inorganic blocks and contacting exposed portions of the first organic layer between the first inorganic blocks.

2. The device as claimed in claim 1, wherein the inorganic blocks increase a flexibility of the encapsulation member.

3. The device as claimed in claim 2, wherein the organic layers include at least one of an epoxy resin, an acrylate resin, and a urethane acrylate resin.

4. The device as claimed in claim 2, wherein the inorganic layers include at least one of silicon nitride, silicon oxide, copper oxide, iron oxide, titanium oxide, zinc selenium, and aluminum oxide.

5. The device as claimed in claim 1, wherein the encapsulation member further includes a third inorganic layer including a plurality of third inorganic blocks that are separate from each other, the third inorganic blocks contacting the second inorganic blocks and exposed portions of the first inorganic layer, the third inorganic layer being on the second inorganic layer.

6. The device as claimed in claim 5, wherein the first inorganic blocks of the first inorganic layer are arranged in a lattice shape, the second inorganic blocks of the second inorganic layer are arranged in the lattice shape, and the third inorganic blocks of the third inorganic layer are arranged in the lattice shape.

7. The device as claimed in claim 5, wherein the first inorganic blocks of the first inorganic layer are arranged in a stripe shape, the second inorganic blocks of the second inorganic layer are arranged in the stripe shape, and the third inorganic blocks of the third inorganic layer are arranged in the stripe shape.

8. The device as claimed in claim 1, wherein the encapsulation member includes:
    a first organic layer covering the substrate;
    a first inorganic layer including a plurality of first inorganic blocks that are separate from each other, the first inorganic layer being on the first organic layer;
    a second organic layer including a plurality of second organic blocks that contact exposed portions of the first organic layer and that partially contact the first inorganic blocks, the second organic layer being on the first inorganic layer;
    a second inorganic layer including a plurality of second inorganic blocks that are separate from each other, the second inorganic blocks contacting adjacent exposed portions of the first inorganic blocks, the second inorganic layer being on the second organic layer; and
    a third organic layer covering the second organic layer and the second inorganic layer.

9. The device as claimed in claim 8, wherein the encapsulation member further includes:
    a fourth organic layer including a plurality of fourth organic blocks that contact exposed portions of the second organic layer and that partially contact the second inorganic blocks, the fourth organic layer being on the second inorganic layer; and
    a third inorganic layer including a plurality of third inorganic blocks that are separate from each other, the third inorganic blocks contacting adjacent exposed portions of the second inorganic blocks, the third inorganic layer being on the fourth organic layer.

10. The device as claimed in claim 9, wherein the first inorganic blocks of the first inorganic layer are arranged in a lattice shape, the second inorganic blocks of the second inorganic layer are arranged in the lattice shape, and the third inorganic blocks of the third inorganic layer are arranged in the lattice shape.

11. The device as claimed in claim 9, wherein the first inorganic blocks of the first inorganic layer are arranged in a stripe shape, the second inorganic blocks of the second inorganic layer are arranged in the stripe shape, and the third inorganic blocks of the third inorganic layer are arranged in the striped shape.

12. The device as claimed in claim 1, wherein the plurality of organic layers of the encapsulation substrate includes:
    a first organic layer covering the substrate; and
    a second organic layer covering the first inorganic layer and the second inorganic layer.

13. The device as claimed in claim 12, wherein the second organic layer directly contacts and covers the first inorganic layer and the second inorganic layer, the second organic layer filling spaces between the second inorganic blocks and contacting exposed surfaces of the first inorganic blocks between the second inorganic blocks.

14. The device as claimed in claim 12, wherein the first inorganic layer is on the first organic layer, and
    wherein the second inorganic layer contacts exposed portions of the first organic layer between the first inorganic blocks.

* * * * *